United States Patent
Saito et al.

(10) Patent No.: US 10,868,232 B2
(45) Date of Patent: Dec. 15, 2020

(54) PIEZOELECTRIC MATERIAL, MANUFACTURING METHOD FOR PIEZOELECTRIC MATERIAL, PIEZOELECTRIC ELEMENT, VIBRATION WAVE MOTOR, OPTICAL EQUIPMENT, AND ELECTRONIC DEVICE

(71) Applicant: CANON KABUSHIKI KAISHA, Tokyo (JP)

(72) Inventors: Hiroshi Saito, Kawasaki (JP); Akira Uebayashi, Tokyo (JP); Tomohiro Watanabe, Yokohama (JP); Yuto Niinuma, Yokohama (JP); Yasushi Shimizu, Fujisawa (JP); Toshihiko Akatsuka, Yuki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 489 days.

(21) Appl. No.: 15/895,376

(22) Filed: Feb. 13, 2018

(65) Prior Publication Data

US 2018/0233655 A1  Aug. 16, 2018

(30) Foreign Application Priority Data

Feb. 14, 2017 (JP) ................. 2017-025090
Feb. 9, 2018 (JP) ................. 2018-022426

(51) Int. Cl.
*H01L 41/187* (2006.01)
*H01L 41/083* (2006.01)
(Continued)

(52) U.S. Cl.
CPC .......... *H01L 41/1871* (2013.01); *H01L 41/04* (2013.01); *H01L 41/083* (2013.01);
(Continued)

(58) Field of Classification Search
CPC ... H01L 41/1871; H01L 41/04; H01L 41/083; H01L 41/257; H01L 41/297; H01L 41/43; H02N 2/001; H02N 2/163
(Continued)

(56) References Cited

U.S. PATENT DOCUMENTS 7,931,821 B2  4/2011  Saito et al.
8,182,713 B2  5/2012  Ren et al.
(Continued)

FOREIGN PATENT DOCUMENTS

JP  2009-215111 A  9/2009

OTHER PUBLICATIONS

Bernard Jaffe et al., "Piezoelectric Ceramics", pp. 82-83 (1971).
Saburo Nagakura et al. (ed.), Iwanami Physicochemical Dictionary, Fifth Edition, pp. 1-3 (Iwanami Shoten, Publishers; Feb. 1998) (English language translation).

*Primary Examiner* — Thomas M Dougherty
(74) *Attorney, Agent, or Firm* — Venable LLP

(57) ABSTRACT

A piezoelectric material includes a metal oxide containing at least Ba, Ca, Ti, Zr, and Mn, in which the piezoelectric material has a perovskite structure, in which: x, which represents a ratio of a content (mol) of Ca to A (mol) representing a total content of Ba and Ca, falls within a range of $0.10 \leq x \leq 0.18$; y, which represents a ratio of a content (mol) of Zr to B (mol) representing a total content of Ti, Zr, and Mn, falls within a range of $0.055 \leq y \leq 0.085$; and z, which represents a ratio of a content (mol) of Mn to the B (mol), falls within a range of $0.003 \leq z \leq 0.012$, and in which the piezoelectric material satisfies a relationship of $0 \leq (|d_{31(-20u)}| - d_{31(-20d)}|)/|d_{31(-20u)}| \leq 0.08$, and has a value of 130 pm/V or more for each of $|d_{31(-20u)}|$ and $|d_{31(-20d)}|$.

12 Claims, 6 Drawing Sheets

(51) Int. Cl.
  *H01L 41/43* (2013.01)
  *H02N 2/00* (2006.01)
  *H01L 41/04* (2006.01)
  *H01L 41/297* (2013.01)
  *H01L 41/257* (2013.01)
  *H02N 2/16* (2006.01)

(52) U.S. Cl.
  CPC .......... *H01L 41/257* (2013.01); *H01L 41/297* (2013.01); *H01L 41/43* (2013.01); *H02N 2/001* (2013.01); *H02N 2/163* (2013.01)

(58) Field of Classification Search
  USPC ....... 310/358; 252/62.9 PZ, 62.9 R; 501/134
  See application file for complete search history.

(56) References Cited

U.S. PATENT DOCUMENTS

| | | | |
|---|---|---|---|
| 8,518,290 B2 | 8/2013 | Watanabe et al. | |
| 8,547,001 B2 | 10/2013 | Saito et al. | |
| 9,252,685 B2* | 2/2016 | Ifuku | G02B 27/0006 |
| 9,425,380 B2* | 8/2016 | Hayashi | H01L 41/09 |
| 9,614,141 B2* | 4/2017 | Shimizu | B41J 2/14233 |
| 9,660,175 B2* | 5/2017 | Saito | B41J 2/14233 |
| 2015/0116428 A1* | 4/2015 | Hamada | H01L 41/0805 |
| | | | 347/68 |
| 2019/0044054 A1* | 2/2019 | Watanabe | H01L 41/0471 |
| 2019/0378970 A1* | 12/2019 | Uebayashi | C04B 35/62655 |

* cited by examiner

PIEZOELECTRIC MATERIAL, MANUFACTURING METHOD FOR PIEZOELECTRIC MATERIAL, PIEZOELECTRIC ELEMENT, VIBRATION WAVE MOTOR, OPTICAL EQUIPMENT, AND ELECTRONIC DEVICE

BACKGROUND OF THE INVENTION

Field of the Invention

The present invention relates to a piezoelectric material, and more particularly, to a lead-free piezoelectric material. The present invention also relates to a piezoelectric element, a vibration wave motor, an optical equipment, and an electronic device each using the piezoelectric material.

Description of the Related Art

Lead zirconate titanate containing lead is a typical piezoelectric material, and is used in a variety of piezoelectric devices, such as an actuator, an oscillator, a sensor, and a filter. However, a lead content in a discarded piezoelectric material may elute into soil to adversely affect an ecosystem. Accordingly, in order to exclude lead from piezoelectric devices, research and development on lead-free piezoelectric materials are actively conducted.

In Japanese Patent Application Laid-Open No. 2009-215111, as a lead-free piezoelectric material excellent in piezoelectric constant, there is disclosed a barium titanate-based material having the following composition: $\{[(Ba_{1-x1}M1_{x1})\ ((Ti_{1-x}Zr_x)_{1-y1}N1_{y1})O_3]-\delta\%\ [((Ba_{1-y}Ca_y)_{1-x2}M2_{x2})(Ti_{1-y2}N2_{y2})O_3]\}$ (M1, N1, M2, and N2 each represent an additive element). The first-end component $(Ba_{1-x1}M1_{x1})\ ((Ti_{1-x}Zr_x)_{1-y1}N1_{y1})O_3$ is a rhombohedral crystal, and the second-end component $((Ba_{1-y}Ca_y)_{1-x2}M2_{x2})(Ti_{1-y2}N2_{y2})O_3$ is a tetragonal crystal. In the barium titanate-based material of Japanese Patent Application Laid-Open No. 2009-215111, a phase transition temperature between the rhombohedral crystal and the tetragonal crystal is adjusted to about room temperature by forming a solid solution of two components of different crystal systems. For example, there is a disclosure in Japanese Patent Application Laid-Open No. 2009-215111 that $BaTi_{0.8}Zr_{0.2}O_3$–50% $Ba_{0.7}Ca_{0.3}TiO_3$ had a phase transition temperature of about room temperature and a piezoelectric constant $d_{33}$ at 20° C. of 584 pC/N. Meanwhile, there is a disclosure that the material had a piezoelectric constant $d_{33}$ at 70° C. of 368 pC/N. That is, as a result of a temperature increase of 50° C., the piezoelectric constant $d_{33}$ was decreased by as much as 37% as compared to the piezoelectric constant $d_{33}$ at 20° C.

Meanwhile, in FIG. 5.21 of Bernard Jaffe et al., "Piezoelectric Ceramics", 1971, Academic Press, there is a disclosure that the barium titanate-based material has so-called hysteresis (temperature history) in which the piezoelectric constant during temperature increase and the piezoelectric constant during temperature decrease differ from each other in the vicinity of the phase transition temperature. That is, the barium titanate-based material having a large piezoelectric constant as disclosed in Japanese Patent Application Laid-Open No. 2009-215111 had a problem of having hysteresis in piezoelectric constant in an operation temperature range (e.g., from −30° C. to 60° C.) Although the hysteresis can be shifted out of the operation temperature range through composition adjustment, there has been another problem in that the piezoelectric constant in the operation temperature range is significantly lowered.

A practical piezoelectric device is required to stably operate in the operation temperature range irrespective of its temperature history. When behavior of the piezoelectric device varies depending on the temperature history, driving of the piezoelectric device is difficult to control or its guaranteeable operating performance is lowered. For example, when a piezoelectric material having large hysteresis in piezoelectric constant is used for a rotary vibration wave motor, the number of rotations of the motor significantly varies depending on temperature history up to its use temperature. Accordingly, when a drive circuit is designed in accordance with the maximum piezoelectric constant, in the case where the piezoelectric constant is decreased owing to the temperature history, the number of rotations of the motor is lowered. On the other hand, when the drive circuit is designed in accordance with the minimum piezoelectric constant, in the case where the piezoelectric constant is increased owing to the temperature history, abnormal rotation or failure may occur.

The related-art lead-free piezoelectric material had a problem in that the driving of the piezoelectric device was difficult to control. The present invention has been made in order to solve such problem, and provides a piezoelectric material that is free of lead, has small temperature dependence and hysteresis in piezoelectricity within an operation temperature range, and has a high mechanical quality factor and satisfactory piezoelectricity. The present invention also provides a piezoelectric element, a multilayered piezoelectric element, a liquid ejection head, a liquid ejection apparatus, a vibration wave motor, an optical equipment, a vibration apparatus, a dust removing apparatus, an image pickup apparatus, and an electronic device each of which uses the piezoelectric material and is excellent in driving controllability.

SUMMARY OF THE INVENTION

According to an aspect of the present invention, there is provided a piezoelectric material, including a metal oxide containing at least Ba, Ca, Ti, Zr, and Mn, in which the piezoelectric material has a perovskite structure, in which: x, which represents a ratio of a content (mol) of Ca to A (mol) representing a total content of Ba and Ca, falls within a range of $0.10 \leq x \leq 0.18$; y, which represents a ratio of a content (mol) of Zr to B (mol) representing a total content of Ti, Zr, and Mn, falls within a range of $0.055 \leq y \leq 0.085$; and z, which represents a ratio of a content (mol) of Mn to the B (mol), falls within a range of $0.003 \leq z \leq 0.012$, and in which the piezoelectric material satisfies a relationship of $0 \leq (|d_{31(-20u)}| - d_{31(-20d)}|)/|d_{31(-20u)}| \leq 0.08$, and has a value of 130 pm/V or more for each of $|d_{31(-20u)}|$ and $|d_{31(-20d)}|$, where: $d_{31(-20u)}$ represents a piezoelectric constant $d_{31}$ measured by increasing a temperature of the piezoelectric material from −30° C. to −20° C.; and $d_{31(-20d)}$ represents a piezoelectric constant $d_{31}$ measured by decreasing the temperature of the piezoelectric material from 25° C. to −20° C.

According to another aspect of the present invention, there is provided a manufacturing method for the above-mentioned piezoelectric material, including at least: obtaining granules for forming by coating, with a binder, raw material powder containing at least one kind selected from the group consisting of the following raw material 1, raw material 2, and raw material 3 each having a perovskite structure; obtaining a compact by forming the granules for forming; and obtaining the piezoelectric material by sintering the compact under a calcination condition of a temperature of up to 1,200° C. or more and 1,450° C. or less, the raw material 1 containing Ba, Ti, and Zr, in which p, which represents a ratio of a content of Zr to a total content (mol) of Ti and Zr, falls within a range of 0.00005≤p≤0.0020, the raw material 2 containing Ca, Ti, and Zr, in which q, which represents a ratio of a content of Zr to a total content (mol) of Ti and Zr, falls within a range of 0.00005≤q≤0.0200, the raw material 3 containing Ca, Ti, and Zr, in which r, which represents a ratio of a content (mol) of Ti to a total content (mol) of Ti and Zr, falls within a range of 0.00005≤r≤0.0060.

According to still another aspect of the present invention, there is provided a piezoelectric element, including: a first electrode; a piezoelectric material portion; and a second electrode, in which a piezoelectric material for forming the piezoelectric material portion includes the above-mentioned piezoelectric material.

According to yet another aspect of the present invention, there is provided a vibration wave motor, including: a vibrating body including the above-mentioned piezoelectric element; and a moving body to be brought into contact with the vibrating body.

According to still a further aspect of the present invention, there is provided an optical equipment, including a drive unit, in which the drive unit includes the above-mentioned vibration wave motor.

According to yet another aspect of the present invention, there is provided an electronic device, including the above-mentioned piezoelectric element as a driving source.

According to the present invention, the piezoelectric material that has small temperature dependence and hysteresis in piezoelectricity, and has a high mechanical quality factor and satisfactory piezoelectricity, thereby being excellent in driving controllability of a piezoelectric device, can be provided. The piezoelectric material of the present invention does not use lead, and hence has a small load on the environment. According to the present invention, the manufacturing method for the piezoelectric material can also be provided.

According to the present invention, the piezoelectric element, the vibration wave motor, and the electronic device each using the piezoelectric material can also be provided.

Further features of the present invention will become apparent from the following description of exemplary embodiments with reference to the attached drawings.

DESCRIPTION OF THE EMBODIMENTS

Figure 1:
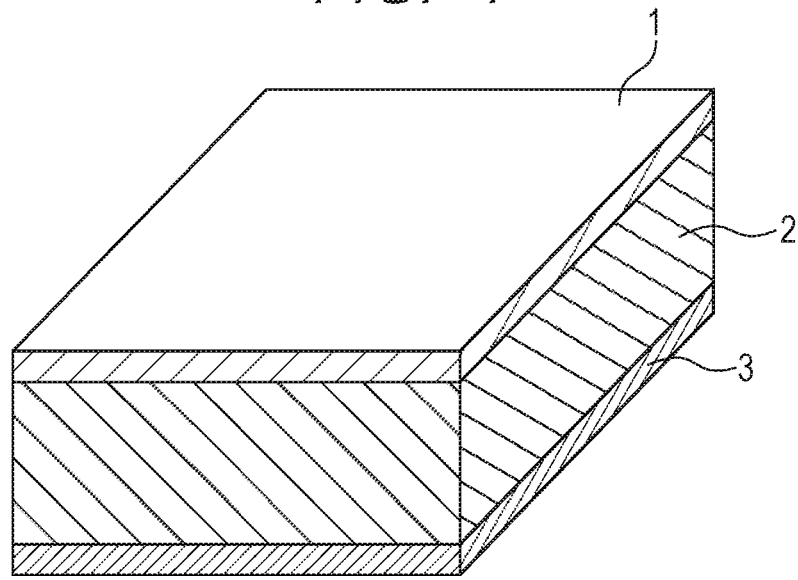
FIG. 1 is a schematic view for illustrating a configuration of a piezoelectric element according to an embodiment of the present invention.

Preferred embodiments of the present invention will now be described in detail in accordance with the accompanying drawings.

Embodiments of the present invention are described below.

(Piezoelectric Material)

A piezoelectric material according to the present invention includes a metal oxide containing at least Ba, Ca, Ti, Zr, and Mn, in which the piezoelectric material has a perovskite structure, in which: x, which represents a ratio of a content (mol) of Ca to A (mol) representing a total content of Ba and Ca, falls within a range of 0.10≤x≤0.18; y, which represents a ratio of a content (mol) of Zr to B (mol) representing a total content of Ti, Zr, and Mn, falls within a range of 0.055≤y≤0.085; and z, which represents a ratio of a content (mol) of Mn to the B (mol), falls within a range of 0.003≤z≤0.012, and in which the piezoelectric material satisfies a relationship of $0 \leq (|d_{31(-20u)}| - d_{31(-20d)}|)/|d_{31(-20u)}| \leq 0.08$, and has a value of 130 pm/V or more for each of $|d_{31(-20u)}|$ and $|d_{31(-20d)}|$, where: $d_{31(-20u)}$ represents a piezoelectric constant $d_{31}$ measured by increasing a temperature of the piezoelectric material from −30° C. to −20° C.; and $d_{31(-20d)}$ represents a piezoelectric constant $d_{31}$ measured by decreasing the temperature of the piezoelectric material from 25° C. to −20° C.

When the metal oxide containing at least Ba, Ca, Ti, Zr, and Mn is expressed by the chemical formula of a perovskite-type metal oxide, the metal oxide may be represented as in the following general formula (1).

$$(Ba_{1-x}Ca_x)_a(Ti_{1-y-z}Zr_yMn_z)O_3 \quad (1)$$

(where 0.10≤x≤0.18, 0.055≤y≤0.085, and 0.003≤z≤0.012)

In the present invention, main components of the piezoelectric material are preferably formed of Ba, Ca, Ti, Zr, Mn, and O. The main components of the piezoelectric material being formed of Ba, Ca, Ti, Zr, Mn, and O means that, in analysis of the composition of the piezoelectric material, the top six elements in abundance ratio in terms of molar amount are selected from the group consisting of Ba, Ca, Ti, Zr, Mn, and O. The piezoelectric material preferably contains Ba, Ca, Ti, Zr, Mn, and O in a total amount of 98.5 mol % or more.

(Form of Piezoelectric Material)

The form of the piezoelectric material according to the present invention is not limited and may be any one of a ceramics, powder, a monocrystal, a thin film, a slurry, granulated powder, a compact, and the like. In particular, it is preferred that the piezoelectric material be a ceramics. The term "ceramics" as used herein refers to an aggregate (also referred to as "bulk body") of crystal grains, a so-called polycrystal, which contains a metal oxide as a basic component and is baked by a heat treatment. The ceramics include ones processed after sintering.

(Perovskite Structure)

In the present invention, the perovskite-type metal oxide refers to a metal oxide having a perovskite-type structure (sometimes referred to as "perovskite structure") that is ideally a cubic structure as described in Iwanami Rikagaku Jiten 5th Edition (published by Iwanami Shoten on Feb. 20, 1998). The metal oxide having a perovskite structure is generally represented by the chemical formula $ABO_3$. In the perovskite-type metal oxide, elements A and B occupy specific positions in a unit cell, which are called an A site and a B site, respectively, in the form of ions. For example, in the case of a cubic unit cell, the A site element occupies the corners of a cubic, and the B site element occupies a body-centered position of the cubic. An O element occupies the face-centered positions of the cubic as an anion of oxygen.

The metal oxide represented by the general formula (1) means that metal elements positioned at the A site are Ba and Ca, and metal elements positioned at the B site are Ti, Zr, and Mn. However, part of Ba and Ca may be positioned at the B site. Similarly, part of Ti, Zr, and Mn may be positioned at the A site.

In the general formula (1), the molar ratio between the elements at the B site and the O element is 1:3, and the case where the ratio of element amounts is shifted slightly, for example, within 1% also falls within the scope of the present invention as long as the metal oxide has a perovskite structure as a main phase.

It can be determined, for example, by subjecting the piezoelectric material to X-ray diffraction or electron beam diffraction that the metal oxide has a perovskite structure. As long as the perovskite structure is a main crystal phase, the piezoelectric material may additionally contain another crystal phase.

(Composition Ratio of Piezoelectric Material)

In the piezoelectric material of the present invention, the value of x, which represents the ratio of the content (mol) of Ca to A (mol) representing the total content of Ba and Ca, falls within the range of $0.10 \leq x \leq 0.18$. When the value of x falls within the range of $0.10 \leq x \leq 0.18$, the fluctuation in piezoelectric constant with temperature in the operation temperature range (e.g., from −30° C. to 60° C.) is decreased.

When x represents less than 0.10, a phase transition temperature at which the piezoelectric constant becomes maximum exists within the operation temperature range, and hence the fluctuation in piezoelectric constant in the operation temperature range becomes as large as, for example, 170%, with the result that the driving performance of a piezoelectric device is hindered.

Meanwhile, when x represents more than 0.18, the piezoelectric constant in the operation temperature range is generally small with, for example, the $d_{31}$ constant being 50 pm/V or less.

A case in which x represents 0.12 or more and 0.16 or less is more preferred because the suppression of the fluctuation in piezoelectric constant with temperature and a large piezoelectric constant are both achieved.

In the piezoelectric material of the present invention, y, which represents the ratio of the content (mol) of Zr to B (mol) representing the total content of Ti, Zr, and Mn, falls within the range of $0.055 \leq y \leq 0.085$. When y falls within the range of $0.055 \leq y \leq 0.085$, the piezoelectric constant at each temperature in the operation temperature range (e.g., from −30° C. to 60° C.) is generally large. When y represents less than 0.055, the piezoelectric constant in the operation temperature range becomes insufficient, and electric power necessary for driving the piezoelectric device becomes excessive.

Meanwhile, when y represents more than 0.085, the Curie temperature becomes as low as, for example, less than 100° C., and the operation guaranteed temperature range of the piezoelectric device is narrowed.

In the piezoelectric material of the present invention, z, which represents the ratio of the content (mol) of Mn to B (mol), falls within the range of $0.003 \leq z \leq 0.012$. When z falls within the range of $0.003 \leq z \leq 0.012$, the insulation property of the piezoelectric material becomes satisfactory. Mn has a property of varying in valence between divalent and tetravalent, and plays a role in compensating for a deficiency in charge balance in the piezoelectric material.

When z represents less than 0.003, the insulation property-enhancing effect of the incorporation of Mn is reduced. Meanwhile, when z represents more than 0.012, the addition amount of Mn becomes excessive to cause its precipitation in the piezoelectric material. Also in this case, the insulation property-enhancing effect is reduced. As a result, a current that flows in the piezoelectric material at the time of driving increases, and electric power necessary for driving the piezoelectric device becomes excessive.

(Hysteresis in Piezoelectric Constant)

A piezoelectric constant $d_{31}$ measured by increasing the temperature of the piezoelectric material from −30° C. to −20° C. is represented by $d_{31(-20u)}$. The temperature of the piezoelectric material at the time of the measurement is −20° C., but an error of about ±0.1° C. is allowable. A temperature history before the temperature increase from −30° C. is not limited, but heating that induces depolarization is avoided. A method for the heating from −30° C. to −20° C. and a heating rate are not limited, but excessive heating beyond −20° C. is restricted to at most +0.5° C. (−19.5° C.)

The piezoelectric constant $d_{31}$ and electromechanical quality factor $Q_m$ of the piezoelectric material may be determined by calculation, from the measurement results of a resonance frequency and an antiresonance frequency, which are obtained with a commercially available impedance analyzer, based on the standard of Japan Electronics and Information Technology Industries Association (JEITA EM-4501). This method is hereinafter referred to as resonance-antiresonance method.

A piezoelectric constant $d_{31}$ measured by decreasing the temperature of the piezoelectric material from 25° C. to −20° C. is represented by $d_{31(-20d)}$. The temperature of the piezoelectric material at the time of the measurement is −20° C., but an error of about ±0.1° C. is allowable. A temperature history before the temperature decrease from 25° C. is not limited, but heating that induces depolarization is avoided. A method for the cooling from 25° C. to −20° C. and a cooling rate are not limited, but excessive cooling beyond −20° C. is restricted to at most −0.5° C. (−20.5° C.)

The piezoelectric constants of the piezoelectric material in the present invention preferably have a relationship of $0 \leq (|d_{31(-20u)} - d_{31(-20d)}|)/|d_{31(-20u)}| \leq 08$. When the variation in piezoelectric constant at −20° C. of the piezoelectric material between the time of the temperature increase and the time of the temperature decrease is within 8%, the device can be precisely controlled. The variation is more preferably within 7%, still more preferably within 6%.

Meanwhile, a $(|d_{31(-20u)} - d_{31(-20d)}|)/|d_{31(-20u)}|$ of more than 0.08 means that the piezoelectric constant at −20° C. is inconstant because a variation in piezoelectric property due to the temperature history of the piezoelectric material is increased. Accordingly, in a practical piezoelectric device, it is difficult to know its temperature history at the time of use, and hence the precision of the control of the driving of the piezoelectric device is not obtained.

(Absolute Values of Piezoelectric Constants)

In the piezoelectric material of the present invention, it is preferred that both piezoelectric constants, i.e., the $|d_{31(-20u)}|$ and the $|d_{31(-20d)}|$ be 130 pm/V or more. In a practical piezoelectric device, under a use environment at −20° C., a peripheral member, such as a rubber member, is more hardened than at room temperature to often impede piezoelectric operation. Therefore, at −20° C., a piezoelectric constant $d_{31}$ of 130 pm/V or more is required irrespective of the temperature history of the piezoelectric material.

When at least one of the $|d_{31(-20u)}|$ or the $|d_{31(-20d)}|$ of the piezoelectric material is less than 130 pm/V, the operation guaranteed temperature range of the piezoelectric device is narrowed.

(Temperature Dependence)

When the piezoelectric constant $d_{31}$ at 25° C. of the piezoelectric material is represented by $d_{31(rt)}$ and a relationship of $1 \le (|d_{31(-20u)}|+|d_{31(-20d)}|)/2|d_{31(rt)}| \le 2$ is satisfied, the fluctuation in piezoelectric property between room temperature and −20° C. is decreased, and hence the input electric power to the piezoelectric material in the piezoelectric device is stable against temperature. Such case is preferred because the piezoelectric device can be driven with a simple electric power supply circuit.

(Mechanical Quality Factor at Low Temperature)

The piezoelectric material desirably has a mechanical quality factor $Q_m$ at −20° C. of 400 or more. At a temperature as low as −20° C., device characteristics tend to be lowered owing to a change in temperature of a constituent member of the device. Therefore, a case in which the mechanical quality factor $Q_m$ at −20° C. is 400 or more is more desired because the device characteristics can be maintained even at low temperature. For example, the number of rotations of a rotary vibration wave motor tends to be lowered at low temperature owing to, for example, deformation of a constituent member caused by a temperature change, or an increase in sliding loss caused by hardening of grease to be used. When the mechanical quality factor $Q_m$ at −20° C. is 400 or more, the tendency of the number of rotations to be lowered can be alleviated.

(Molar Ratio between A Site and B Site)

In the general formula (1), a, which represents the ratio between A (mol) and B (mol), more preferably represents 0.98 or more and 1.01 or less. A case in which a falls within the above-mentioned range is desired because the crystal grain size of the piezoelectric material as a ceramics falls within the range of from 3 μm to 30 μm and sufficient strength of the piezoelectric material is obtained.

(Bi Amount)

It is more preferred that the piezoelectric material include a secondary component formed of Bi and the molar ratio of Bi to the metal oxide be 0.15% or more and 0.40% or less. When the piezoelectric material of the present invention contains the secondary component formed of Bi in the above-mentioned range, the mechanical quality factor $Q_m$ in a low-temperature region, for example, at −20° C. becomes as large as 400 or more, and the control of the piezoelectric device in the low-temperature region becomes easy.

(Thin Film)

When the piezoelectric material of the present invention is used as a film formed on a substrate, it is desired that the thickness of the piezoelectric material be 200 nm or more and 10 μm or less, more preferably 300 nm or more and 3 μm or less. This is because, when the film thickness of the piezoelectric material is set to 200 nm or more and 10 82 m or less, a sufficient electromechanical converting function as a piezoelectric element is obtained.

A method of forming the film is not particularly limited. Examples thereof include chemical solution deposition (CSD), a sol-gel process, metalorganic chemical vapor deposition (MOCVD), sputtering, pulse laser deposition (PLD), hydrothermal synthesis, and aerosol deposition (AD). Of those, chemical solution deposition or sputtering is the most preferred formation method. The chemical solution deposition or the sputtering can easily increase the area of the film to be formed.

It is preferred that the substrate to be used for the piezoelectric material of the present invention be a monocrystalline substrate cut and polished along a (001) plane or a (110) plane. With the use of a monocrystalline substrate cut and polished along a specific crystal plane, a piezoelectric material film formed on the surface of the substrate can also be strongly oriented in the same direction.

(Piezoelectric Element)

A piezoelectric element using the piezoelectric material of the present invention is described below.

(Structure)

FIG. 1 is a schematic view for illustrating a configuration of a piezoelectric element according to an embodiment of the present invention. The piezoelectric element according to the present invention is a piezoelectric element including at least a first electrode 1, a piezoelectric material portion 2, and a second electrode 3, in which the piezoelectric material portion 2 is the piezoelectric material of the present invention.

That is, the piezoelectric element includes electrodes and a piezoelectric material portion, in which a piezoelectric material for forming the piezoelectric material portion is the above-mentioned piezoelectric material.

(Electrodes)

The piezoelectric property of the piezoelectric material according to the present invention can be evaluated by forming the piezoelectric element including at least the first electrode and the second electrode. The first electrode and the second electrode are each formed of a conductive layer having a thickness of from about 5 nm to about 10 μm. A material therefor is not particularly limited and only needs to be one to be generally used for a piezoelectric element. Examples thereof may include metals, such as Ti, Pt, Ta, Ir, Sr, In, Sn, Au, Al, Fe, Cr, Ni, Pd, Ag, and Cu, and compounds thereof.

Each of the first electrode and the second electrode may be formed of one kind of those materials, or may be obtained by stacking two or more kinds thereof. In addition, the first electrode and the second electrode may be formed of different materials, respectively. That is, the following configuration may be adopted: the piezoelectric element has a multilayered structure in which the electrodes and the piezoelectric material portion are stacked alternately.

A manufacturing method for the first electrode and the second electrode is not limited. The first electrode and the second electrode may be formed by baking a metal paste or by sputtering, vapor deposition, or the like. In addition, both the first electrode and the second electrode may be patterned in desired shapes before use.

(Polarization)

It is more preferred that the piezoelectric material and the piezoelectric element have spontaneous polarization axes aligned in a certain direction. When the spontaneous polarization axes are aligned in a certain direction, the piezoelectric constant of the piezoelectric element increases. The fact that the piezoelectric material and the piezoelectric element have spontaneous polarization axes aligned in a certain direction may be confirmed by the presence of remanent polarization in polarization-electric field (P-E) hysteresis measurement.

A polarization method for the piezoelectric element is not particularly limited. The polarization treatment may be performed in the air or may be performed in silicone oil. A temperature at which the polarization is performed is preferably a temperature of from 60° C. to 150° C. However, an optimum condition slightly varies depending on the composition of a piezoelectric material for forming the element. An electric field to be applied for performing the polarization treatment is preferably from 600 V/mm to 2.0 kV/ram.

(Insulation Property)

The piezoelectric material of the present invention preferably has a dielectric loss tangent at 25° C. and a frequency of 1 kHz of 0.006 or less. The piezoelectric material of the present invention preferably has a resistivity at 25° C. of 1 GΩcm or more. In the case where the dielectric loss tangent is 0.006 or less, stable operation can be obtained even when an electric field of up to 500 V/cm is applied to the piezoelectric material under the driving conditions of the element. When the resistivity is 1 GΩcm or more, the effect of the polarization treatment is sufficiently obtained. The dielectric loss tangent and the resistivity may be measured by applying, for example, an alternating electric field having a frequency of 1 kHz and an electric field intensity of 10 V/cm through the use of an impedance analyzer.

(Density Measurement)

The density of a sintered body may be measured, for example, by the Archimedes method. In the present invention, a ratio of a measured density ($\rho_{meas.}$) to a theoretical density ($\rho_{calc.}$) determined from the composition and lattice constant of the sintered body, i.e., a relative density ($\rho_{meas.}/\rho_{calc.}$), of 95% or more may be said to be sufficiently high as a piezoelectric material.

(Crystal Grain)

The "grain size" in the present invention refers to an "equivalent circle diameter of a projected area" generally called in a microscopic observation method and represents a diameter of a true circle having the same area as a projected area of a crystal grain. In the present invention, a method of measuring the grain size is not particularly limited. For example, the grain size may be determined by image processing of a photographic image obtained by photographing the surface of the piezoelectric material with a polarization microscope or a scanning electron microscope. An optimum magnification ratio varies depending on a grain size to be measured, and hence an optical microscope or an electron microscope may be used depending on the grain size to be measured. The equivalent circle diameter may be determined from an image of a polished surface or a cross-section instead of the surface of the material.

(Curie temperature)

The Curie temperature $T_c$ refers to a temperature at or above which the piezoelectricity of the piezoelectric material is lost. Herein, a temperature at which the dielectric constant becomes maximum in the vicinity of a phase transition temperature between a ferroelectric phase (tetragonal phase) and a paraelectric phase (cubic phase) is defined as the $T_c$. The dielectric constant is measured, for example, by applying an alternating electric field having a frequency of 1 kHz and an electric field intensity of 10 V/cm through the use of an impedance analyzer.

The piezoelectric material of the present invention preferably has a Curie temperature $T_c$ of 100° C. or more. By virtue of the presence of the Curie temperature $T_c$ at 100° C. or more, the piezoelectric material according to the present invention can maintain piezoelectricity without its loss even under a harsh condition of 80° C., which is assumed to occur in a car during the summer, and can have a stable piezoelectric constant and mechanical quality factor.

(Phase Transition)

The piezoelectric material of the present invention undergoes successive phase transition from a rhombohedral crystal, to an orthorhombic crystal, to a tetragonal crystal, and to a cubic crystal along with an increase in temperature from low temperature. The phase transition as mentioned herein refers exclusively to phase transition from an orthorhombic crystal to a tetragonal crystal, or from a tetragonal crystal to an orthorhombic crystal. A phase transition temperature may be evaluated by a measurement method similar to that for the Curie temperature, and a temperature at which a value obtained by differentiating the dielectric constant with respect to a sample temperature becomes maximum is defined as the phase transition temperature. A crystal system may be evaluated by X-ray diffraction, electron diffraction, Raman scattering, or the like.

In the vicinity of the phase transition temperature, the dielectric constant and the electromechanical coupling coefficient become maximum, and the Young's modulus becomes minimum. The piezoelectric constant is a function of those three parameters, and shows a maximum value or an inflection point in the vicinity of the phase transition temperature. Accordingly, if the phase transition is present in the vicinity of the central value of the operation temperature range of the device, the performance of the device extremely fluctuates with temperature, or the resonance frequency fluctuates with temperature to make the control of the device difficult. In addition, in the vicinity of the phase transition temperature, hysteresis in which the piezoelectric constant takes different values in a temperature increase process and a temperature decrease process is shown. When the hysteresis is too large, the piezoelectric constant significantly fluctuates depending on the temperature history, and hence it becomes remarkably difficult to design a device.

Therefore, it is desired that the phase transition, which is the biggest factor of the fluctuation in piezoelectric performance, be not present in the vicinity of the central value of the operation temperature range. As the phase transition temperature gets farther away from the operation temperature range, for example, when the phase transition temperature is −10° C. or less and −50° C. or more, the temperature dependence of the piezoelectric performance in the operation temperature range is lowered, which is preferred from the viewpoint of controlling the device.

However, as described above, the piezoelectric constant shows a maximum value in the vicinity of the phase transition temperature. Accordingly, when the phase transition temperature is too far away from the operation temperature range, the piezoelectric constant is lowered. This is not desired because the lowering of the piezoelectric constant increases the driving voltage of the device. In other words, it is desired that the controllability and piezoelectric constant of the device be both achieved by controlling the relationship between the phase transition temperature and the operation temperature range based on the composition of the piezoelectric material.

(Temperature Dependence Measurement)

The temperature dependence of each of the piezoelectric constant and electromechanical quality factor of the piezoelectric element measured using the resonance-antiresonance method may be measured as described below. The piezoelectric element is placed in a thermostatic chamber, and an ambient temperature is changed. The change rate of the temperature is not particularly limited, but the temperature may be changed at from 1° C./min to 10° C./min. After the temperature has been changed, it is desired that the temperature be kept constant until the temperature of the piezoelectric element follows the ambient temperature, and then the piezoelectric constant and the electromechanical quality factor be measured using the resonance-antiresonance method because the reproducibility of measurement results is increased. Although not particularly limited, a period of time for which the temperature is kept constant is desirably from 1 minute to 10 minutes.

(Manufacturing Method for Piezoelectric Material)

A manufacturing method for the piezoelectric material according to the present invention is not particularly limited.

(Raw Material)

Raw material powder of the piezoelectric material according to the present invention is not particularly limited, but at least one kind selected from the group consisting of a raw material 1, a raw material 2, and a raw material 3 each having a perovskite structure as described below is desirably used.

Raw material 1: raw material containing Ba, Ti, and Zr, in which p, which represents a ratio of a content of Zr to a total content (mol) of Ti and Zr, falls within a range of $0.00005 \leq p \leq 0.0020$ Raw material 2: raw material containing Ca, Ti, and Zr, in which q, which represents a ratio of a content of Zr to a total content (mol) of Ti and Zr, falls within a range of $0.00005 \leq q \leq 0.0200$ Raw material 3: raw material containing Ca, Ti, and Zr, in which r, which represents a ratio of a content of Ti to a total content (mol) of Ti and Zr, falls within a range of $0.00005 \leq r \leq 0.0060$ When such raw material 1, raw material 2, and raw material 3 are used, a small composition distribution of each crystal grain is formed at the time of sintering. However, when the composition distribution of each crystal grain is too large, sinterability is poor and density is difficult to increase, and hence there is a risk in that the piezoelectric property may be lowered. A case in which the raw material 1, the raw material 2, and the raw material 3 fall within the ranges of $0.00005 \leq p \leq 0.0020$, $0.00005 \leq q \leq 0.0200$, and $0.00005 \leq r \leq 0.0060$, respectively, is desired because the phase transition is made diffuse by the composition distribution and the lowering of the piezoelectric property can be suppressed. Consequently, the hysteresis of the piezoelectric material can be reduced and a satisfactory piezoelectric property can be obtained.

The following raw material 4 or raw material 5 having a perovskite structure as described below may be used as the raw material powder of the piezoelectric material according to the present invention.

Raw material 4: raw material containing Ba, Ca, Ti, and Zr, in which s, which represents a ratio of a content of Zr to a total content (mol) of Ti and Zr, falls within a range of $0.00005 \leq s \leq 0.0020$ Raw material 5: raw material containing Ba, Ca, Ti, and Zr, in which t, which represents a ratio of a content of Zr to a total content (mol) of Ti and Zr, falls within a range of $0.00005 \leq t \leq 0.0200$ As a manufacturing method for the raw material powder of the piezoelectric material according to the present invention, a general technique involving sintering solid powder of, for example, an oxide, carbonate, nitrate, or oxalate containing constituent elements under normal pressure may be adopted. The solid powder is formed of a metal compound, such as a Ba compound, a Ca compound, a Ti compound, a Zr compound, a Mn compound, or a Bi compound.

Examples of the Ba compound that may be used include barium oxide, barium carbonate, barium oxalate, barium acetate, barium nitrate, barium titanate, barium zirconate, and barium zirconate titanate.

Examples of the Ca compound that may be used include calcium oxide, calcium carbonate, calcium oxalate, calcium acetate, calcium titanate, and calcium zirconate.

Examples of the Ti compound that may be used include titanium oxide, barium titanate, barium zirconate titanate, and calcium titanate.

Examples of the Zr compound that may be used include zirconium oxide, barium zirconate, barium zirconate titanate, and calcium zirconate.

Examples of the Mn compound that may be used include manganese carbonate, manganese monoxide, manganese dioxide, tetramanganese trioxide, and manganese acetate.

Examples of the Bi compound that may be used include bismuth oxide and lithium bismuthate.

(Step of obtaining Granules for Forming)

A method of granulating the raw material powder of the piezoelectric material according to the present invention is not particularly limited. Examples of a binder that may be used when the raw material powder is coated and granulated include polyvinyl alcohol (PVA), polyvinyl butyral (PVB), and an acrylic resin. The amount of the binder to be added is preferably from 1 part by weight to 10 parts by weight with respect to 100 parts by weight of the raw material powder, and from the viewpoint of an increase in density of the compact, is more preferably from 2 parts by weight to 5 parts by weight. Mixed powder obtained by mechanically mixing the raw material 1, the raw material 2, the raw material 3, a Bi compound, and a Mn compound may be granulated. Alternatively, mixed powder obtained by mechanically mixing the raw material 4, the raw material 5, a Bi compound, and a Mn compound may be granulated. Alternatively, mixed powder obtained by mechanically mixing a Ba compound, a Ca compound, a Ti compound, a Zr compound, a Bi compound, and a Mn compound may be granulated, or these compounds may be calcined at from about 800° C. to about 1,300° C. and then granulated. Alternatively, after a Ba compound, a Ca compound, a Ti compound, and a Zr compound have been calcined, a binder may be added thereto.

For example, regarding a ratio of the mixing, when weights of the raw material 1, the raw material 2, and the raw material 3 are represented by M1, M2, and M3, respectively, the M1, the M2, and the M3 desirably satisfy the following relationships.

$$0.871 \leq M1/(M1+M2+M3) \leq 0.930$$

$$0.009 \leq M2/(M1+M2+M3) \leq 0.078$$

$$0.043 \leq M3/(M1+M2+M3) \leq 0.070$$

Those ranges are desired because, in a step of obtaining the piezoelectric material by sintering to be described later, a composition shift of a piezoelectric ceramics caused by the volatilization of the raw materials can be reduced, resulting in excellent reproducibility of the piezoelectric property. From such a viewpoint that the grain sizes of the granulated powder can be made more uniform, a spray drying method is the most preferred granulation method.

(Step of obtaining Compact)

A method of producing a compact of a piezoelectric ceramics according to the present invention is not particularly limited. The compact refers to a solid produced from raw material powder, granulated powder, or a slurry. As the method of producing the compact, uniaxial pressing, cold isostatic pressing, hot isostatic pressing, slip casting, extrusion molding, or the like may be used.

(Step of obtaining Piezoelectric Material by Sintering)

A method of sintering the piezoelectric ceramics according to the present invention is not particularly limited. Examples of the sintering method include sintering using an electric furnace, sintering using a gas furnace, a conduction heating method, a microwave sintering method, a millimeter-wave sintering method, and hot isostatic pressing (HIP). The electric furnace and the gas furnace for the sintering may each be a continuous furnace or a batch furnace.

A sintering temperature serving as a calcination condition for the ceramics in the sintering method is not particularly limited. The sintering temperature is preferably a temperature at which each compound reacts to cause sufficient crystal growth. A preferred sintering temperature is 1,200° C. or more and 1,450° C. or less from the viewpoint of causing the grain size of the ceramics to fall within the range of from 3 μm to 30 μm. The sintering temperature is more preferably 1,250° C. or more and 1,420° C. or less. The piezoelectric ceramics sintered in the above-mentioned temperature range exhibits satisfactory piezoelectric performance.

In order to stabilize the properties of the piezoelectric ceramics to be obtained by the sintering treatment with good reproducibility, it is appropriate that the sintering treatment be performed for 2 hours or more and 24 hours or less with the sintering temperature being set constant in the above-mentioned range. A sintering method such as a two-stage sintering method may be used, and a method that does not involve an abrupt temperature change is preferred in consideration of productivity.

(Piezoelectric Element having Multilayered Structure)

A piezoelectric element having a multilayered structure (multilayered piezoelectric element) according to the present invention is a multilayered piezoelectric element including a plurality of piezoelectric material layers and a plurality of electrodes including an internal electrode stacked alternately, in which the piezoelectric material layers are each formed of the piezoelectric material of the present invention.

Figure 2A:
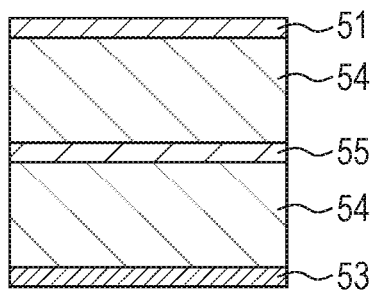
FIG. 2A and FIG. 2B are schematic sectional views for illustrating a configuration of a piezoelectric element having a multilayered structure according to an embodiment of the present invention.
Figure 2B:
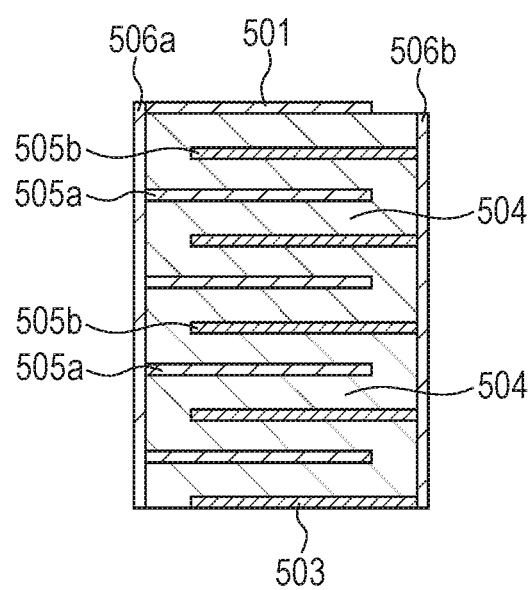

FIG. 2A and FIG. 2B are each a schematic sectional view for illustrating a configuration of a multilayered piezoelectric element according to an embodiment of the present invention. The multilayered piezoelectric element according to the present invention is a multilayered piezoelectric element including piezoelectric material layers 54 and electrodes including an internal electrode 55, the piezoelectric material layers and layers of the electrodes being stacked alternately, in which the piezoelectric material layers 54 are each formed of the above-mentioned piezoelectric material. The electrodes may include external electrodes, such as a first electrode 51 and a second electrode 53, in addition to the internal electrode 55.

FIG. 2A is an illustration of the configuration of the multilayered piezoelectric element of the present invention in which two layers of the piezoelectric material layers 54 and the internal electrode 55 serving as one electrode layer are stacked alternately, and the multilayered structure is sandwiched between the first electrode 51 and the second electrode 53. As illustrated in FIG. 2B, the number of piezoelectric material layers and internal electrodes may be increased, and the number of the layers is not limited. The multilayered piezoelectric element of FIG. 2B has such a configuration that nine layers of piezoelectric material layers 504 and eight layers of internal electrodes 505a and 505b are stacked alternately, and the multilayered structure is sandwiched between a first electrode 501 and a second electrode 503. The multilayered piezoelectric element of FIG. 2B further includes an external electrode 506a and an external electrode 506b for short-circuiting the alternately formed internal electrodes.

The internal electrodes 55 and 505 and the external electrodes 506a and 506b do not need to be identical in size and shape to the piezoelectric material layers 54 and 504, and may be divided into a plurality of portions. The internal electrodes 55 and 505, the external electrodes 506a and 506b, the first electrodes 51 and 501, and the second electrodes 53 and 503 are each formed of a conductive layer having a thickness of from about 5 nm to about 10 μm.

A material for each of the electrodes is not particularly limited and only needs to be one to be generally used for a piezoelectric element. Examples thereof may include metals, such as Ti, Pt, Ta, Ir, Sr, In, Sn, Au, Al, Fe, Cr, Ni, Pd, Ag, and Cu, and compounds thereof. Each of the internal electrodes 55 and 505 and the external electrodes 506a and 506b may be formed of one kind thereof, may be formed of a mixture or alloy of two or more kinds, or may be formed of a multilayered body of two or more kinds thereof. In addition, a plurality of electrodes may be respectively formed of materials different from each other.

From the viewpoint that an electrode material is inexpensive, it is preferred that the internal electrodes 55 and 505 each contain at least any one kind selected from the group consisting of Ni and Cu. When at least any one kind selected from the group consisting of Ni and Cu is used for each of the internal electrodes 55 and 505, the multilayered piezoelectric element of the present invention is preferably calcined in a reducing atmosphere.

In the multilayered piezoelectric element of the present invention, the internal electrode contains Ag and Pd, and a weight ratio M1/M2 between the content weight M1 of the Ag and the content weight M2 of the Pd preferably falls within the range of $0.25 \leq M1/M2 \leq 4.0$. A case in which the weight ratio M1/M2 is less than 0.25 is not desired because the sintering temperature of the internal electrode increases. Meanwhile, a case in which the weight ratio M1/M2 is more than 4.0 is not desired because the internal electrode becomes island-shaped, resulting in in-plane non-uniformity. The weight ratio M1/M2 more preferably falls within the range of $0.3 \leq M1/M2 \leq 3.0$.

As illustrated in FIG. 2B, a plurality of electrodes including the internal electrodes 505a and 505b may be short-circuited to each other for the purpose of making the phases of their driving voltages uniform. For example, the internal electrode 505a and the first electrode 501 may be short-circuited through the external electrode 506a. The internal electrode 505b and the second electrode 503 may be short-circuited through the external electrode 506b. The internal electrode 505a and the internal electrode 505b may be alternately arranged. In addition, a mode in which the electrodes are short-circuited to each other is not limited. An electrode or wiring for short-circuiting may be provided on a side surface of the multilayered piezoelectric element, or the electrodes may be short-circuited to each other by forming a through-hole passing through the piezoelectric material layer 504 and arranging a conductive material inside the through-hole.

(Vibration Wave Motor)

Figure 3A:
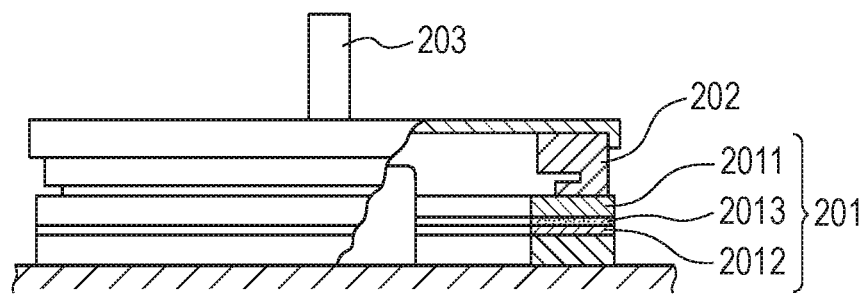
FIG. 3A and FIG. 3B are schematic views for illustrating a configuration of a vibration wave motor according to an embodiment of the present invention.
Figure 3B:
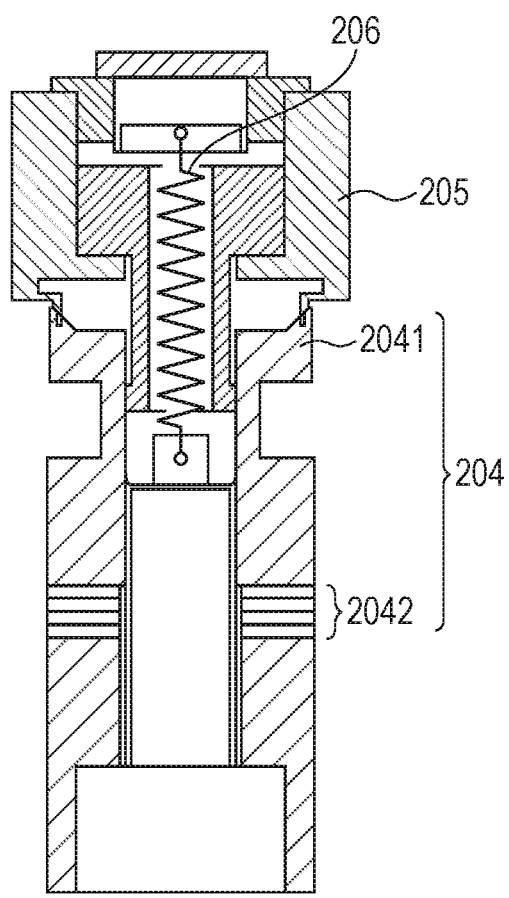

A vibration wave motor according to the present invention includes at least a vibrating body provided with the piezoelectric element or the multilayered piezoelectric element, and a moving body to be brought into contact with the vibrating body. FIG. 3A and FIG. 3B are each a schematic view for illustrating a configuration of a vibration wave motor according to an embodiment of the present invention.

FIG. 3A is an illustration of a vibration wave motor in which the piezoelectric element of the present invention is formed of a single plate. The vibration wave motor includes an oscillator 201, a rotor 202, which is brought into contact with the sliding surface of the oscillator 201 with a pressure applied by a pressurizing spring (not shown), and an output shaft 203 arranged so as to be integrated with the rotor 202. The oscillator 201 is formed of a metal elastic ring 2011, a piezoelectric element 2012 of the present invention, and an organic adhesive 2013 for bonding the piezoelectric element 2012 to the elastic ring 2011 (such as an epoxy- or cyanoacrylate-based adhesive).

The piezoelectric element 2012 of the present invention is formed of a piezoelectric material sandwiched between a first electrode (not shown) and a second electrode (not shown). The application of two alternating voltages different from each other in phase by an odd multiple of $\pi/2$ to the piezoelectric element of the present invention results in the generation of a flexural traveling wave in the oscillator 201, and hence each point on the sliding surface of the oscillator 201 undergoes an elliptical motion. When the rotor 202 is brought into press contact with the sliding surface of the oscillator 201, the rotor 202 receives a frictional force from the oscillator 201 to rotate in the direction opposite to the flexural traveling wave. A body to be driven (not shown) is joined to the output shaft 203, and is driven by the rotary force of the rotor 202. The application of a voltage to the piezoelectric material results in the expansion and contraction of the piezoelectric material due to a transverse piezoelectric effect. When an elastic body, such as a metal, is joined to the piezoelectric element, the elastic body is bent by the expansion and contraction of the piezoelectric material. The vibration wave motor of the kind described in the foregoing utilizes this principle.

Next, a vibration wave motor including a piezoelectric element having a multilayered structure is illustrated in FIG. 3B. An oscillator 204 is formed of a multilayered piezoelectric element 2042 sandwiched between tubular metal elastic bodies 2041. The multilayered piezoelectric element 2042 is an element formed of a plurality of stacked piezoelectric materials (not shown), and includes a first electrode and a second electrode on its outer surfaces of the stack, and internal electrodes on its inner surface of the stack. The metal elastic bodies 2041 are fastened with bolts so that the piezoelectric element 2042 may be sandwiched between and fixed by the bodies. Thus, the oscillator 204 is formed. The application of alternating voltages different from each other in phase to the piezoelectric element 2042 causes the oscillator 204 to excite two vibrations orthogonal to each other. The two vibrations are combined to form a circular vibration for driving the tip portion of the oscillator 204. A constricted annular groove is formed in the upper portion of the oscillator 204 to enlarge the displacement of the vibration for driving. A rotor 205 is brought into contact with the oscillator 204 under pressure by a spring 206 for pressurization to obtain a frictional force for driving. The rotor 205 is rotatably supported by a bearing.

(Optical Equipment including Vibration Wave Motor)

Next, an optical equipment of the present invention is described. The optical equipment of the present invention includes a drive unit including the vibration wave motor.

Figure 4A:
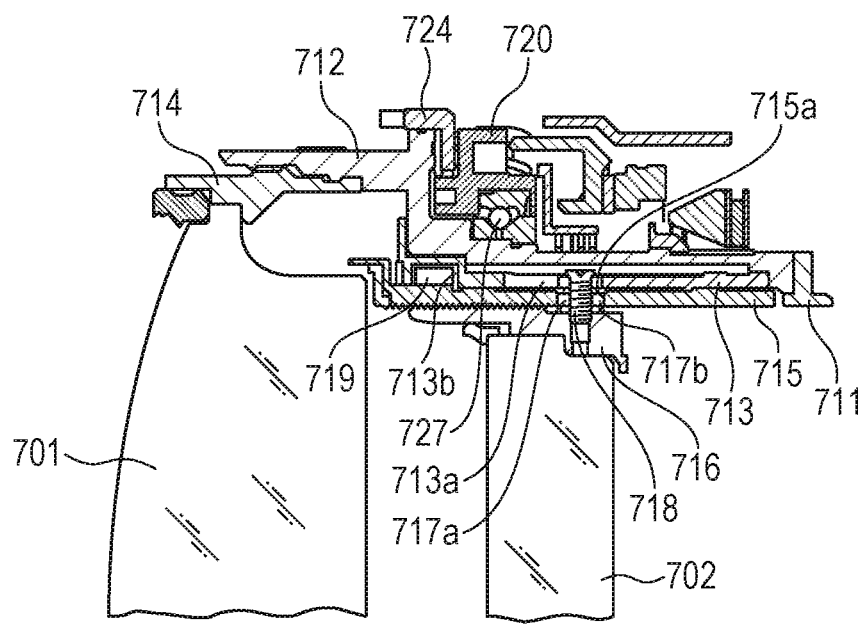
FIG. 4A and FIG. 4B are schematic views for illustrating an optical equipment according to an embodiment of the present invention.
Figure 4B:
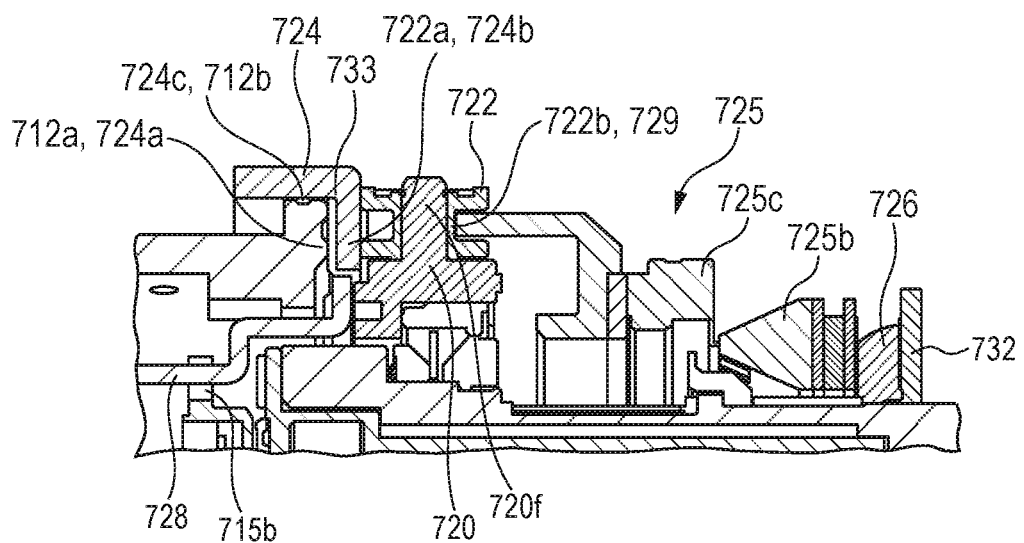
Figure 5:
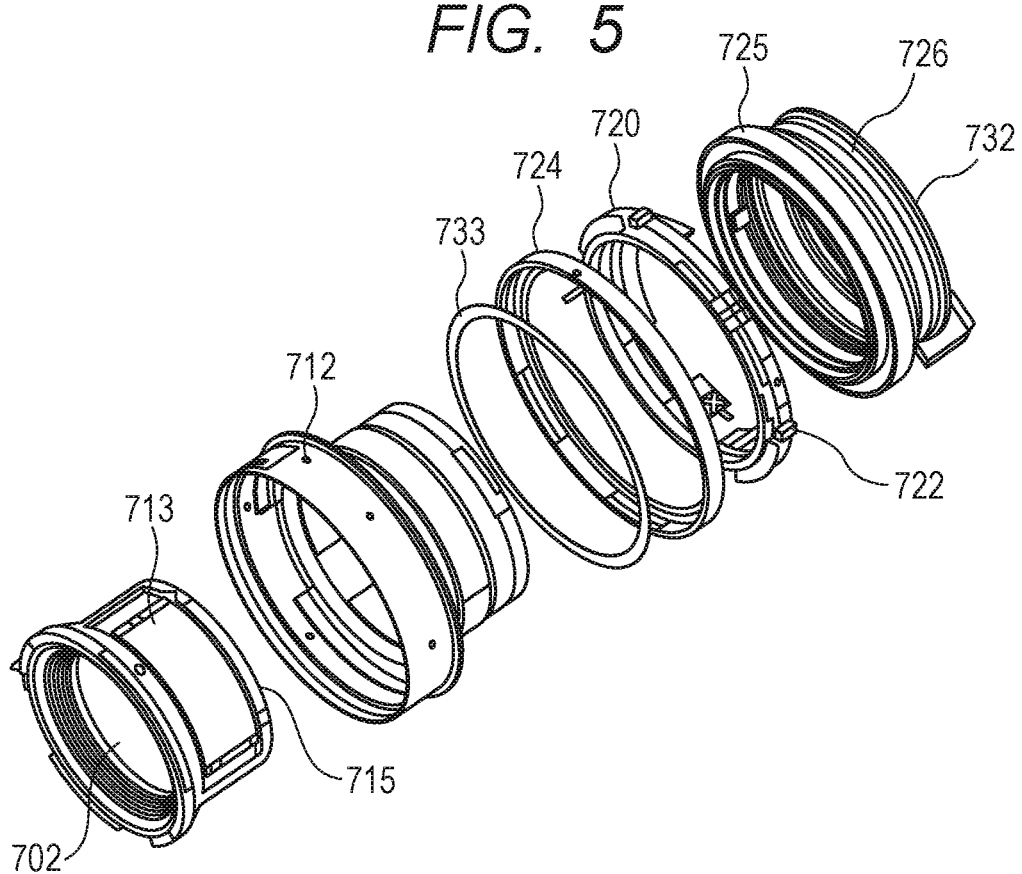
FIG. 5 is a schematic view for illustrating the optical equipment according to the embodiment of the present invention.

FIG. 4A and FIG. 4B are each a sectional view of main parts of an interchangeable lens barrel for a single-lens reflex camera as an example of an optical equipment according to a preferred embodiment of the present invention. In addition, FIG. 5 is an exploded perspective view of the interchangeable lens barrel for the single-lens reflex camera as the example of the optical equipment according to the preferred embodiment of the present invention. A fixed barrel 712, a linear guide barrel 713, and a front unit barrel 714 are fixed to an attaching/detaching mount 711 for a camera. Those members are fixed members of the interchangeable lens barrel.

A linear guide groove 713a in an optical axis direction for a focus lens 702 is formed on the linear guide barrel 713. Cam rollers 717a and 717b protruding outward in a radial direction are fixed to a rear unit barrel 716 holding the focus lens 702 via axial screws 718, and the cam roller 717a is fitted in the linear guide groove 713a.

A cam ring 715 is fitted on the inner periphery of the linear guide barrel 713 in a rotatable manner. Relative movement between the linear guide barrel 713 and the cam ring 715 in the optical axis direction is restricted because a roller 719 fixed to the cam ring 715 is fitted in an annular groove 713b of the linear guide barrel 713. A cam groove 715a for the focus lens 702 is formed on the cam ring 715, and the above-mentioned cam roller 717b is simultaneously fitted in the cam groove 715a. On the outer peripheral side of the fixed barrel 712, there is arranged a rotation transmission ring 720 held by a ball race 727 in a rotatable manner at a constant position with respect to the fixed barrel 712. The rotation transmission ring 720 has shafts 720f extending radially from the rotation transmission ring 720, and rollers 722 are held by the shafts 720f in a rotatable manner. A large diameter part 722a of the roller 722 is brought into contact with a mount side end surface 724b of a manual focus ring 724. In addition, a small diameter part 722b of the roller 722 is brought into contact with a joining member 729. Six rollers 722 are arranged on the outer periphery of the rotation transmission ring 720 at regular intervals, and each roller is arranged in the relationship as described above.

A low friction sheet (washer member) 733 is arranged on an inner diameter part of the manual focus ring 724, and this low friction sheet is sandwiched between a mount side end surface 712a of the fixed barrel 712 and a front side end surface 724a of the manual focus ring 724. In addition, an outer diameter surface of the low friction sheet 733 is formed in a ring shape so as to be circumferentially fitted on an inner diameter part 724c of the manual focus ring 724. Further, the inner diameter part 724c of the manual focus ring 724 is circumferentially fitted on an outer diameter part 712b of the fixed barrel 712. The low friction sheet 733 has a role of reducing friction in a rotation ring mechanism in which the manual focus ring 724 rotates relatively to the fixed barrel 712 about the optical axis.

The large diameter part 722a of the roller 722 is brought into contact with the mount side end surface 724b of the manual focus ring under a state in which a pressure is applied by a pressing force of a waved washer 726 pressing a vibration wave motor 725 to the front of the lens. In addition, similarly, the small diameter part 722b of the roller 722 is brought into contact with the joining member 729 under a state in which an appropriate pressure is applied by a pressing force of the waved washer 726 pressing the vibration wave motor 725 to the front of the lens.

Movement of the waved washer 726 in the mount direction is restricted by a washer 732 connected to the fixed barrel 712 by bayonet joint. A spring force (biasing force) generated by the waved washer 726 is transmitted to the vibration wave motor 725, and further to the roller 722, to be a force for the manual focus ring 724 to press the mount side end surface 712a of the fixed barrel 712. In other words, the manual focus ring 724 is integrated under a state in which the manual focus ring 724 is pressed to the mount side end surface 712a of the fixed barrel 712 via the low friction sheet 733.

Therefore, when a control unit (not shown) drives the vibration wave motor 725 to rotate with respect to the fixed barrel 712, the rollers 722 rotate about the shafts 720f because the joining member 729 is brought into frictional contact with the small diameter parts 722b of the rollers 722. As a result of the rotation of the rollers 722 about the shafts 720f, the rotation transmission ring 720 rotates about the optical axis (automatic focus operation).

In addition, when a manual operation input portion (not shown) gives a rotation force about the optical axis to the manual focus ring 724, the following action occurs. That is, the rollers 722 rotate about the shafts 720f by friction force because the mount side end surface 724b of the manual focus ring 724 is brought into contact by pressure to the large diameter parts 722a of the rollers 722. When the large diameter parts 722a of the rollers 722 rotate about the shafts 720f, the rotation transmission ring 720 rotates about the optical axis. In this case, the vibration wave motor 725 does not rotate because of a friction retaining force between a rotor 725c and a stator 725b (manual focus operation).

Two focus keys 728 are mounted to the rotation transmission ring 720 at opposing positions, and the focus key 728 is fitted to a notch portion 715b arranged on the tip of the cam ring 715. Therefore, when the automatic focus operation or the manual focus operation is performed so that the rotation transmission ring 720 is rotated about the optical axis, the rotation force is transmitted to the cam ring 715 via the focus key 728. When the cam ring is rotated about the optical axis, the rear unit barrel 716 whose rotation is restricted by the cam roller 717a and the linear guide groove 713a is moved forward and backward along the cam groove 715a of the cam ring 715 by the cam roller 717b. Thus, the focus lens 702 is driven, and the focus operation is performed.

While the interchangeable lens barrel for the single-lens reflex camera has been described as the optical equipment of the present invention, the optical equipment of the present invention can be applied to any optical equipment including the drive unit including the vibration wave motor, regardless of a type of the camera, including a compact camera, an electronic still camera, a personal digital assistant with a camera, and the like.

(Electronic Device)

Next, an electronic device of the present invention is described. The electronic device of the present invention includes the piezoelectric element or the multilayered piezoelectric element as a driving source. Examples of the electronic device include electronic devices including internal piezoelectric acoustic components, such as a speaker, a buzzer, a microphone, and a surface acoustic wave (SAW) element.

Figure 6:
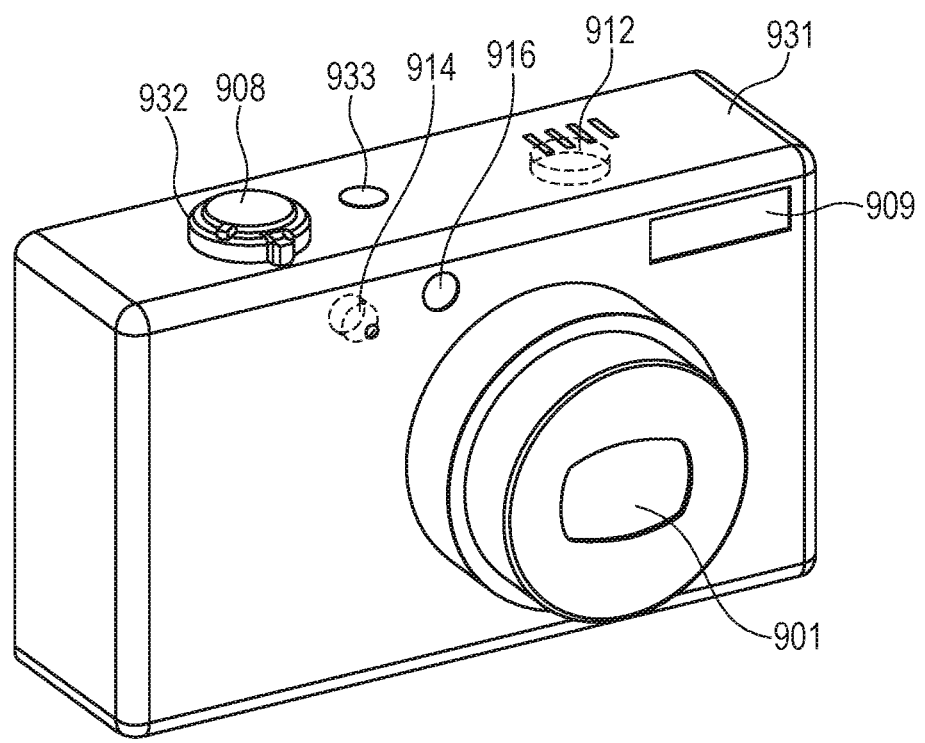
FIG. 6 is a schematic view for illustrating an electronic device according to an embodiment of the present invention.

FIG. 6 is a general perspective view of a main body 931 of a digital camera as an example of an electronic device according to a preferred embodiment of the present invention, as viewed from the front. An optical equipment 901, a microphone 914, a stroboscopic light emission unit 909, and a fill light unit 916 are arranged on a front surface of the main body 931. The microphone 914 is installed in the main body, and hence is illustrated by a broken line. In the front of the microphone 914, there is a hole shape provided for collecting external sound.

A power button 933, a speaker 912, a zoom lever 932, and a release button 908 for performing a focus operation are arranged on the top surface of the main body 931. The speaker 912 is installed in the main body 931, and hence is illustrated by a broken line. In the front of the speaker 912, there is a hole shape provided for transmitting sound to the outside.

The piezoelectric acoustic component of the present invention is used for at least one of the microphone 914, the speaker 912, or the surface acoustic wave element.

While the digital camera has been described as the electronic device of the present invention, the electronic device of the present invention can also be applied to various types of the electronic device including the piezoelectric acoustic component, such as a sound reproduction device, a sound recording device, a cellular phone, or an information terminal.

As described above, the piezoelectric element and the multilayered piezoelectric element of the present invention is preferably used in a vibration wave motor, an optical equipment, and an electronic device.

Through the use of the piezoelectric element and the multilayered piezoelectric element of the present invention, it is possible to provide the vibration wave motor having a driving force and durability comparable to or higher than those in the case of using the piezoelectric element containing lead.

Through the use of the vibration wave motor of the present invention, it is possible to provide the optical equipment having durability and operation accuracy comparable to or higher than those in the case of using the piezoelectric element containing lead.

Through the use of the piezoelectric acoustic component including the piezoelectric element or the multilayered piezoelectric element of the present invention, it is possible to provide the electronic device having sound producing performance comparable to or higher than that in the case of using the piezoelectric element containing lead.

The piezoelectric material of the present invention can be used in devices such as an ultrasonic oscillator, a piezoelectric actuator, a piezoelectric sensor, and a ferroelectric memory, as well as the liquid ejection head and the motor.

The present invention is hereinafter described more specifically by way of Examples. However, the present invention is not limited to the following Examples.

Piezoelectric materials of the present invention were produced by the following procedure (Examples 1 to 18 and Comparative Examples 1 to 4).

(Composition Measurement of Raw Materials)

A raw material 1, a raw material 2, and a raw material 3 of combinations shown in Table 1 were synthesized by a solid-phase method. The raw material 1, the raw material 2, and the raw material 3 each had a perovskite-type structure.

The raw material 1 is represented by the general formula $Ba(Ti_{1-p}Zr_p)O_3$, the raw material 2 is represented by the general formula $Ca(Ti_{1-q}Zr_q)O_3$, and the raw material 3 is represented by the general formula $Ca(Ti_rZr_{1-r})O_3$. The values of p, q, and r shown in Table 1 are results of performing composition analysis by ICP-MS analysis.

TABLE 1

| Combination | Raw material 1 Zr/Ti + Zr p | Raw material 2 Zr/Ti + Zr q | Raw material 3 Ti/Ti + Zr r |
|---|---|---|---|
| A | 0.00100 | 0.00800 | 0.00300 |
| B | 0.00200 | 0.02000 | 0.00600 |
| C | 0.00005 | 0.00005 | 0.00005 |
| D | 0.00180 | 0.01600 | 0.00500 |
| E | 0.00030 | 0.00030 | 0.00030 |

TABLE 1-continued

| Combination | Raw material 1 Zr/Ti + Zr p | Raw material 2 Zr/Ti + Zr q | Raw material 3 Ti/Ti + Zr r |
|---|---|---|---|
| F | 0.08000 | 0.08000 | 0.08000 |
| G | 0.00002 | 0.00002 | 0.00002 |

A combination in the case of using, as a raw material, a raw material represented by the general formula $(Ba_{1-x}Ca_x)_a(Ti_{1-y-z}Zr_yMn_z)O_3$ was designated as H.

(Production Method)

Figure 7A:
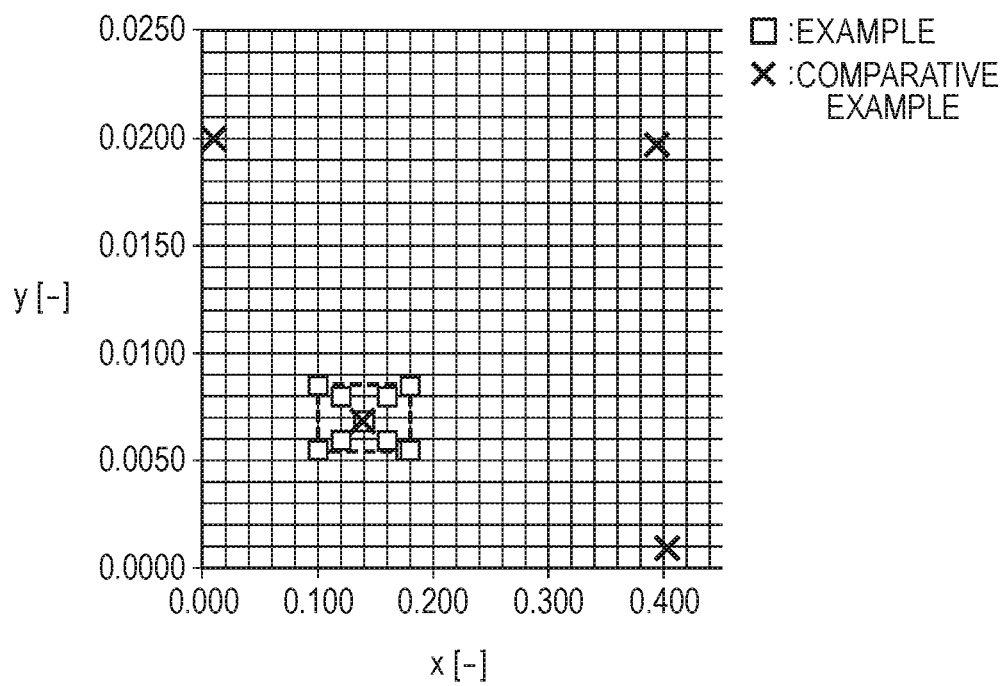
FIG. 7A and FIG. 7B are graphs for showing the abundance ratios of components contained in piezoelectric materials of Examples of the present invention.
Figure 7B:
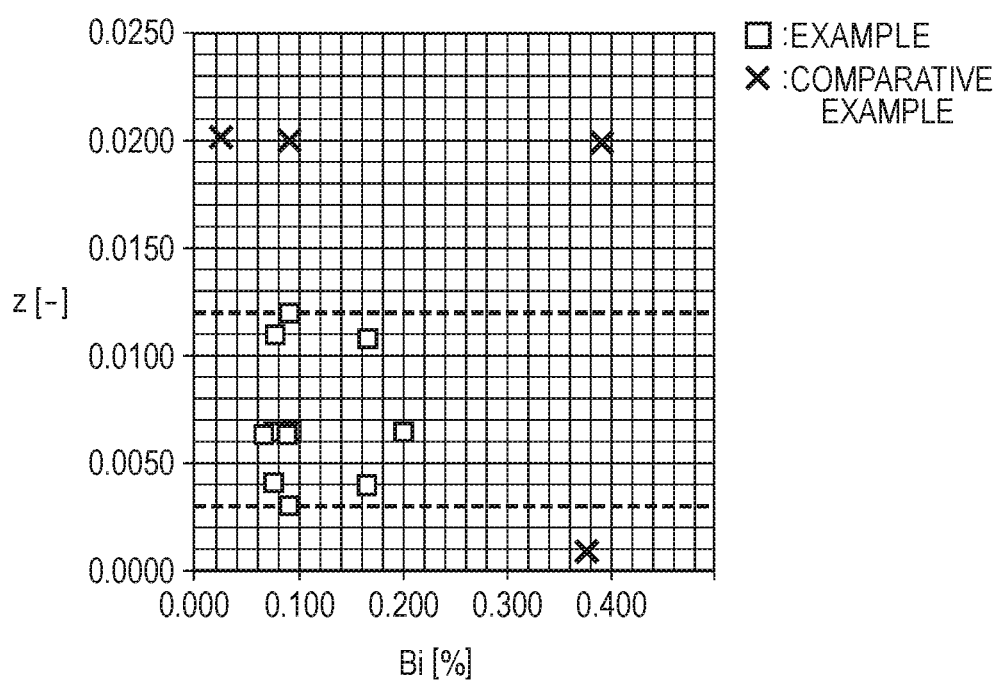

The raw material 1, raw material 2, and raw material 3 shown in Table 1, and tetramanganese trioxide and bismuth oxide were weighed so as to achieve ratios as shown in Table 2. The ratios of compositions are shown in FIG. 7A and FIG. 7B. Those weighed powders were mixed by dry mixing for 24 hours through the use of a ball mill. In order to granulate the obtained mixed powder, 3 parts by weight of a PVA binder with respect to 100 parts by weight of the mixed powder was allowed to adhere to the surface of each mixed powder using a spray dryer apparatus.

Next, the obtained granulated powder was filled in a mold, and a forming pressure of 200 MPa was applied thereto using a press molding machine to produce a disc-shaped compact. The compact may be further pressurized using a cold isostatic pressing molding machine, and similar results were obtained. The obtained compact was placed in an electric furnace, kept at a temperature of up to from 1,300° C. to 1,380° C. for 5 hours, and sintered in an air atmosphere over a total of 24 hours to provide a ceramics-like piezoelectric material of the present invention.

(Composition Measurement of Mixed Powder)

Composition analysis of the mixed powders of the piezoelectric materials was performed by XRF analysis. In the mixed powders of all the piezoelectric materials, the composition of Ba, Ti, Ca, Zr, Mn, and Bi agreed with the weighed composition.

(Composition Analysis)

The obtained ceramics were subjected to composition analysis by XRF analysis. In all the piezoelectric materials, the weighed composition of Ba, Ti, Ca, Zr, Mn, and Bi agreed with the composition thereof after sintering. The distributions of the component ratios of Examples of the piezoelectric materials are shown in FIG. 7A and FIG. 7B.

(X-ray Diffraction Analysis)

The obtained ceramics were each polished so as to have a thickness of 0.5 mm, and their crystal structures were analyzed by X-ray diffraction. As a result, only peaks corresponding to a perovskite structure were observed.

(Crystal Grain Size Measurement)

For the observation of a crystal grain, a polarization microscope was mainly used. For the identification of the grain size of a small crystal grain, a scanning electron microscope (SEM) was used. An average equivalent circle diameter was calculated from the result of the observation. The measurement results are shown in Table 3.

(Density Measurement)

A relative density was evaluated using the ratio of an actually measured density by the Archimedes method to a theoretical density calculated from a lattice constant determined from X-ray diffraction and the weighed composition. The measurement results are shown in Table 3.

(Piezoelectric Element)

Gold electrodes each having a thickness of 400 nm were formed on front and rear surfaces of the disc-shaped ceramics by DC sputtering. Titanium was formed into a film having a thickness of 30 nm as a contact layer between the electrodes and the ceramics. The ceramics with the electrodes was cut to produce a strip-shaped piezoelectric element having a size of 10 mm×2.5 mm×0.5 mm. The surface of a hot plate was set to from 60° C. to 100° C., and an electric field of 1 kV/mm was applied to the obtained piezoelectric element on the hot plate for 30 minutes. Thus, polarization treatment was performed.

TABLE 2

|  | Ca/Ba + Ca x | Zr/Ti + Zr + Mn y | Mn/Ti + Zr + Mn z | Raw material 1 M1/(M1 + M2 + M3) | Raw material 2 M2/(M1 + M2 + M3) | Raw material 3 M3/(M1 + M2 + M3) | A/B a | Bi mol % | Combination of raw materials | Calcination temperature (° C.) |
|---|---|---|---|---|---|---|---|---|---|---|
| Example 1 | 0.14 | 0.070 | 0.006 | 0.901 | 0.043 | 0.056 | 0.9955 | 0.18 | A | 1,340 |
| Example 2 | 0.18 | 0.085 | 0.006 | 0.871 | 0.059 | 0.070 | 0.9957 | 0.18 | B | 1,340 |
| Example 3 | 0.18 | 0.055 | 0.006 | 0.877 | 0.078 | 0.046 | 0.9953 | 0.18 | C | 1,340 |
| Example 4 | 0.10 | 0.085 | 0.007 | 0.923 | 0.009 | 0.068 | 0.9959 | 0.18 | B | 1,340 |
| Example 5 | 0.10 | 0.055 | 0.007 | 0.929 | 0.027 | 0.044 | 0.9951 | 0.18 | C | 1,340 |
| Example 6 | 0.14 | 0.070 | 0.003 | 0.901 | 0.043 | 0.056 | 0.9961 | 0.18 | A | 1,340 |
| Example 7 | 0.14 | 0.070 | 0.012 | 0.900 | 0.043 | 0.057 | 0.9949 | 0.18 | A | 1,340 |
| Example 8 | 0.14 | 0.070 | 0.006 | 0.901 | 0.043 | 0.056 | 0.9947 | 0.15 | A | 1,340 |
| Example 9 | 0.14 | 0.070 | 0.006 | 0.901 | 0.043 | 0.056 | 0.9963 | 0.40 | A | 1,340 |
| Example 10 | 0.14 | 0.070 | 0.006 | 0.901 | 0.043 | 0.056 | 1.0100 | 0.18 | A | 1,380 |
| Example 11 | 0.14 | 0.070 | 0.006 | 0.901 | 0.043 | 0.056 | 0.9800 | 0.18 | A | 1,340 |
| Example 12 | 0.16 | 0.080 | 0.011 | 0.885 | 0.049 | 0.066 | 0.9955 | 0.33 | D | 1,360 |
| Example 13 | 0.16 | 0.060 | 0.004 | 0.889 | 0.062 | 0.049 | 0.9955 | 0.33 | E | 1,340 |
| Example 14 | 0.12 | 0.080 | 0.011 | 0.911 | 0.024 | 0.065 | 0.9955 | 0.15 | D | 1,360 |
| Example 15 | 0.12 | 0.060 | 0.004 | 0.916 | 0.036 | 0.048 | 0.9955 | 0.15 | E | 1,340 |
| Example 16 | 0.18 | 0.055 | 0.006 | 0.877 | 0.078 | 0.046 | 1.0150 | 0.18 | B | 1,390 |
| Example 17 | 0.18 | 0.055 | 0.006 | 0.879 | 0.075 | 0.046 | 0.9750 | 0.18 | C | 1,340 |
| Example 18 | 0.18 | 0.055 | 0.006 | 0.877 | 0.078 | 0.046 | 0.9955 | 0.13 | A | 1,340 |
| Comparative Example 1 | 0.14 | 0.070 | 0.020 | — | — | — | 0.9955 | 0.18 | H | 1,350 |
| Comparative Example 2 | 0.39 | 0.197 | 0.020 | 0.688 | 0.134 | 0.178 | 0.9955 | 0.78 | F | 1,380 |
| Comparative Example 3 | 0.40 | 0.010 | 0.001 | 0.721 | 0.270 | 0.009 | 0.9955 | 0.75 | G | 1,330 |
| Comparative Example 4 | 0.01 | 0.200 | 0.020 | — | — | — | 0.9955 | 0.05 | H | 1,380 |

(Resonance-antiresonance Measurement)

As static characteristics of the piezoelectric elements including the piezoelectric materials corresponding to Examples and Comparative Examples, the piezoelectric constant $d_{31}$ and mechanical quality factor $Q_m$ of each of the piezoelectric elements subjected to the polarization treatment were evaluated by a resonance-antiresonance method using an impedance analyzer (4194A (trade name); manufactured by Agilent Technologies). The measurement results are shown in Table 3.

(Insulation Property Measurement)

As a static characteristic of the piezoelectric elements including the piezoelectric materials corresponding to Examples and Comparative Examples, an insulation property, specifically a dielectric loss tangent was measured at room temperature by applying an alternating electric field having a frequency of 1 kHz and an electric field intensity of 10 V/cm through the use of an impedance analyzer (4194A (trade name); manufactured by Agilent Technologies). The measurement results are shown in Table 3.

(Temperature Dependence Measurement)

Figure 8:
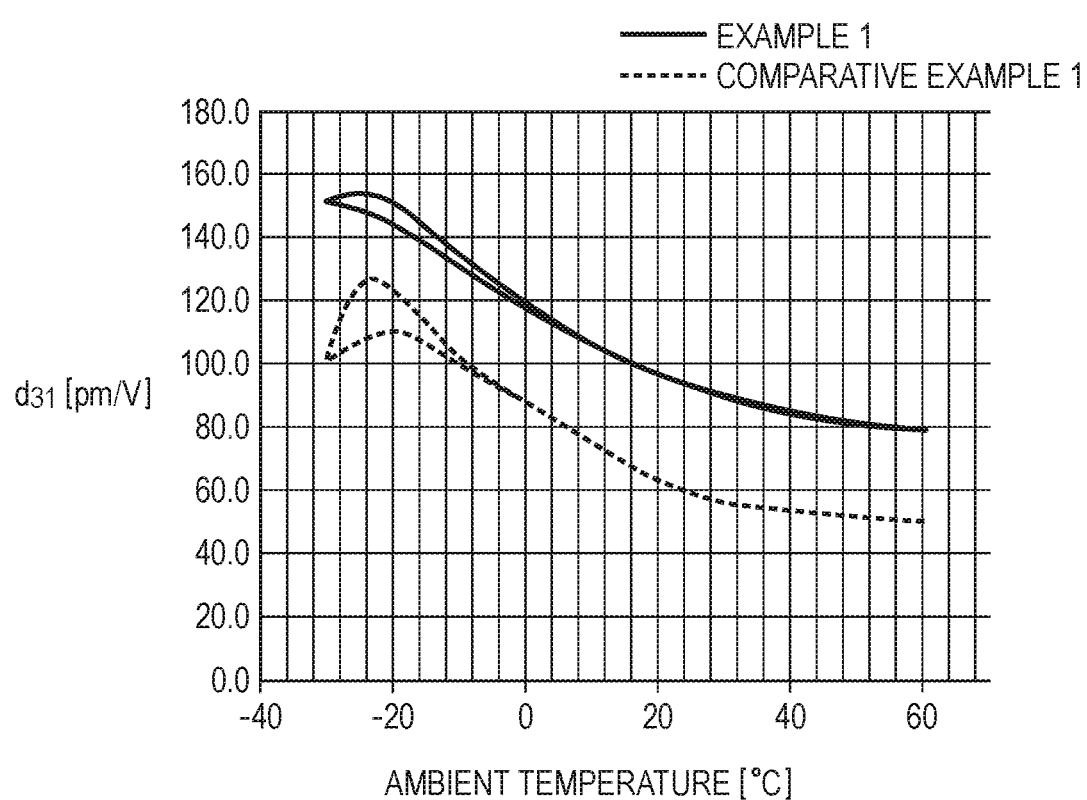
FIG. 8 is a graph for showing the temperature dependence of the piezoelectric constant of a piezoelectric material of Example of the present invention.

The temperature dependence of the piezoelectric constant $d_{31}$ was evaluated as described below. The piezoelectric elements including the piezoelectric materials corresponding to Examples and Comparative Examples were each placed in a thermostatic chamber (SH-261 (trade name); manufactured by ESPEC Corp.), the ambient temperature of the thermostatic chamber was changed, and the piezoelectric constant $d_{31}$ and the mechanical quality factor $Q_m$ were measured by a resonance-antiresonance method. The temperature of the thermostatic chamber was changed at 5° C./min. After having been changed, the temperature was kept for 5 minutes. A piezoelectric constant $d_{31}$ measured by increasing the temperature of a piezoelectric material from −30° C. to −20° C. was represented by $d_{31(-20u)}$, a piezoelectric constant $d_{31}$ measured by decreasing the temperature of the piezoelectric material from 25° C. to −20° C. was represented by $d_{31(-20d)}$, and $(|d_{31(-20u)}-d_{31(-20d)}|)/|d_{31(-20u)}|$ was calculated. The measurement results are shown in Table 3. The results of the temperature dependence of Example 1 and Comparative Example 1 are shown in FIG. 8.

TABLE 3

| | \|d31(rt)\| (pm/V) | Qm (—) | Dielectric loss tangent (—) | Tc (° C.) | Relative density (%) | \|d31(−21u)\| | \|d31(−20d)\| | (\|d31(−20u) − d31(−20d)\|)/ \|d31(−20u)\| | (\|d31(−20u)\| + \|d31(−20d)\|)/ 2\|d31(rt)\| | Qm at −20° C. |
|---|---|---|---|---|---|---|---|---|---|---|
| Example 1 | 95 | 1,507 | 0.002 | 111 | 98 | 145 | 152 | 0.048 | 1.56 | 512 |
| Example 2 | 93 | 1,493 | 0.003 | 101 | 98 | 141 | 151 | 0.070 | 1.57 | 506 |
| Example 3 | 92 | 1,572 | 0.002 | 104 | 99 | 144 | 154 | 0.069 | 1.62 | 511 |
| Example 4 | 112 | 1,534 | 0.002 | 103 | 97 | 147 | 157 | 0.068 | 1.36 | 590 |
| Example 5 | 92 | 1,544 | 0.001 | 104 | 99 | 140 | 150 | 0.069 | 1.57 | 567 |
| Example 6 | 100 | 1,422 | 0.002 | 112 | 97 | 146 | 153 | 0.048 | 1.50 | 551 |
| Example 7 | 91 | 1,843 | 0.002 | 113 | 98 | 142 | 149 | 0.047 | 1.60 | 542 |
| Example 8 | 113 | 1,511 | 0.002 | 113 | 98 | 148 | 155 | 0.047 | 1.34 | 413 |
| Example 9 | 90 | 1,564 | 0.001 | 118 | 99 | 141 | 148 | 0.050 | 1.61 | 601 |
| Example 10 | 93 | 1,520 | 0.003 | 112 | 98 | 141 | 148 | 0.048 | 1.55 | 523 |
| Example 11 | 92 | 1,482 | 0.002 | 116 | 98 | 142 | 149 | 0.050 | 1.58 | 511 |
| Example 12 | 92 | 1,510 | 0.002 | 115 | 97 | 146 | 153 | 0.049 | 1.63 | 537 |
| Example 13 | 91 | 1,523 | 0.002 | 110 | 98 | 144 | 151 | 0.050 | 1.62 | 583 |
| Example 14 | 111 | 1,504 | 0.002 | 117 | 97 | 148 | 155 | 0.048 | 1.37 | 410 |
| Example 15 | 92 | 1,516 | 0.002 | 112 | 99 | 146 | 152 | 0.044 | 1.62 | 420 |
| Example 16 | 83 | 1,204 | 0.002 | 113 | 94 | 134 | 145 | 0.080 | 1.68 | 384 |
| Example 17 | 82 | 1,251 | 0.002 | 118 | 93 | 132 | 140 | 0.060 | 1.66 | 382 |
| Example 18 | 85 | 1,215 | 0.002 | 116 | 93 | 133 | 142 | 0.069 | 1.62 | 389 |
| Comparative Example 1 | 58 | 334 | 0.014 | 89 | 98 | 111 | 124 | 0.113 | 2.03 | 229 |
| Comparative Example 2 | 113 | 413 | 0.021 | 32 | 89 | 51 | 50 | 0.020 | 0.45 | 310 |
| Comparative Example 3 | 41 | 112 | 0.026 | 88 | 88 | 72 | 72 | 0.000 | 1.76 | 92 |
| Comparative Example 4 | 181 | 204 | 0.012 | 31 | 89 | 53 | 54 | 0.019 | 0.30 | 111 |

Comparative Example 1 is not desired as compared to Examples 1 to 18 because the $(|d_{31(-20u)}-d_{31(-20d)}|)/|d_{31(-20u)}|$ is more than 0.08, i.e., hysteresis is large, and the piezoelectric constant $d_{31}$ at −20° C. is low.

Comparative Examples 2 to 4 are not desired as compared to Examples 1 to 18 because the piezoelectric constant $d_{31}$ at −20° C. is less than 130 pm/V.

Comparative Example 3 is not desired as compared to Examples 1 to 18 because y is less than 0.055, and hence the piezoelectric constant at 25° C. is less than 50 pm/V.

Comparative Examples 2 and 4 are not desired as compared to Examples 1 to 18 because y is more than 0.085, and hence Tc is less than 60° C.

Comparative Example 3 is not desired as compared to Examples 1 to 18 because when x is more than 0.18, the piezoelectric constant at 25° C. is less than 50 pm/V.

Comparative Example 4 is not desired as compared to Examples 1 to 18 because x is less than 0.10, and hence the fluctuation in piezoelectric constant is large with the $(|d_{31(-20u)}|+|d_{31(-20d)}|)/2|d_{31(rt)}|$ being much less than 1.

Comparative Examples 1, 2, and 4 are not desired as compared to Examples 1 to 18 because the value of z is more than 0.012, and hence the insulation property becomes poor with the dielectric loss tangent being much more than 0.01.

Comparative Example 3 is not desired as compared to Examples 1 to 18 because the value of z is less than 0.012, and hence the insulation property similarly becomes poor with the dielectric loss tangent being much more than 0.01.

(Example 19) (Vibration Wave Motor)

Through the use of the piezoelectric element of Example 1, the vibration wave motor illustrated in FIG. 3A was produced. It was confirmed that the motor rotated in accordance with an applied alternating voltage.

(Measurement of Temperature Dependence of Number of Rotations of Vibration Wave Motor)

The temperature dependence of the number of rotations of the vibration wave motor using the piezoelectric element of the present invention was evaluated as described below. The vibration wave motor of Example 19 was placed in a thermostatic chamber (SH-642 (trade name); manufactured by ESPEC Corp.). The ambient temperature of the thermostatic chamber was changed, a load torque of 150 g·cm was applied to the vibration wave motor, and the maximum number of rotations was measured under the following conditions. The maximum value of the number of rotations of the vibration wave motor at a time when the frequency of each of sine waves each having a peak value of 70 V was swept from 26 kHz to 29 kHz was defined as the maximum number of rotations. Sine waves of two phases were used for the driving of the vibration wave motor, and the phase difference between the sine waves of two phases was set to 90°. The temperature of the thermostatic chamber was changed at 5° C./min. After having been changed, the temperature was kept for 15 minutes.

(Temperature Dependence of Minimum Value of Motor Number of Rotations of Vibration Wave Motor)

In Table 4, the minimum values of the maximum numbers of rotations at each temperature of ten each of vibration wave motors (Example 19 and Comparative Example 5) produced using the piezoelectric elements of Example 1 and Comparative Example 1 are shown. It is found that the vibration wave motor of Comparative Example 5 is not desired because the piezoelectric material used has large hysteresis, and hence driving becomes unstable, resulting in a low minimum value.

TABLE 4

| | 23° C.<br>Minimum value (rpm) | −20° C.<br>Minimum value (rpm) |
|---|---|---|
| Example 19 | 51 | 41 |
| Comparative Example 5 | 52 | 28 |

(Measurement of Temperature Dependence of Driving Efficiency of Vibration Wave Motor)

The temperature dependence of the driving efficiency of the vibration wave motor using the piezoelectric element of the present invention was evaluated as described below. The driving efficiency of the motor was calculated from the ratio of the power (W) to the input electric power value (W) of the motor. In addition, the input electric power value of the motor was calculated using a voltage value and current value input to the motor, and the power was calculated using the number of rotations of the motor and a load torque.

The vibration wave motor was placed in a thermostatic chamber (SH-642 (trade name); manufactured by ESPEC Corp.), and the ambient temperature of the thermostatic chamber was changed at 5° C./min. After having been changed, the temperature was kept for 15 minutes. After that, a load torque of 150 g·cm was applied to the vibration wave motor, the frequency of each of sine waves of two phases having a phase difference of 90° and each having a peak value of 70 V was swept from 26 kHz to 29 kHz, and the number of rotations and the input electric power value of the motor were measured. Then, the driving efficiency was calculated.

(Temperature Dependence of Driving Efficiency of Vibration Wave Motor)

In Table 5, the average values of driving efficiency at 23° C. and −20° C. of ten each of vibration wave motors of Example 19 and Comparative Example 5 are shown. The driving efficiency was calculated from the number of rotations at a time when a motor input electric power value at which rotation was able to be confirmed in all the vibration wave motors of Example 19 and Comparative Example 5 was 2 W. It is found that the vibration wave motor of Comparative Example 5 is not desired because the piezoelectric material used has large hysteresis, and hence driving becomes unstable, resulting in driving efficiency lower than that of Example 19 by about 20%.

TABLE 5

| | 23° C.<br>Average value of driving efficiency (%) | −20° C.<br>Average value of driving efficiency (%) |
|---|---|---|
| Example 19 | 8.6 | 7.5 |
| Comparative Example 5 | 8.5 | 6.3 |

(Example 20) (Optical Equipment Including Vibration Wave Motor)

Through the use of the vibration wave motor of Example 19, the optical equipment illustrated in FIG. 4A, FIG. 4B, and FIG. 5 was produced. It was confirmed that automatic focus operation was performed in accordance with an applied alternating voltage.

(Example 21) (Piezoelectric Element Having Multilayered Structure)

The raw material 1, the raw material 2, the raw material 3, bismuth oxide ($Bi_2O_3$), and tetramanganese trioxide ($Mn_3O_4$) were weighed so as to achieve the composition of Example 1 of Table 2. The weighed raw material powders were mixed, and mixed overnight in a ball mill to provide mixed powder. PVB was added to and mixed with the obtained mixed powder, and then sheet-forming was performed by a doctor blade method to provide a green sheet having a thickness of 50 μm.

A conductive paste for an internal electrode was printed on the green sheet. As the conductive paste, a Pd paste was used. Nine of the green sheets coated with the conductive paste were stacked, and the multilayered body was calcined under the condition of 1,340° C. for 5 hours to obtain a sintered body. The sintered body was cut to a size of 10 mm×2.5 mm, and then side surfaces thereof were polished. A pair of external electrodes (first electrode and second electrode) for short-circuiting the internal electrodes alternately was formed by Au sputtering to produce a multilayered piezoelectric element as illustrated in FIG. 2B.

The internal electrodes of the obtained multilayered piezoelectric element were observed. As a result, it was found that Pd serving as an electrode material and a piezoelectric material were formed alternately.

The sample was subjected to polarization treatment prior to the evaluation of piezoelectricity. Specifically, the sample was heated to 100° C. in an oil bath, and a voltage of 1 kV/mm was applied between the first electrode and the second electrode for 30 minutes. While the voltage was applied, the sample was cooled to room temperature.

The piezoelectricity of the thus obtained multilayered piezoelectric element was evaluated. As a result, it was found that the multilayered piezoelectric element had a sufficient insulation property, and a satisfactory piezoelectric property comparable to that of the piezoelectric material of Example 1 was able to be obtained.

(Example 22) (Vibration Wave Motor)

Through the use of the multilayered piezoelectric element of Example 21, the vibration wave motor illustrated in FIG. 3B was produced. It was confirmed that the motor rotated in accordance with an applied alternating voltage.

(Example 23) (Optical Equipment Including Vibration Wave Motor)

Through the use of the vibration wave motor of Example 22, the optical equipment illustrated in FIG. 4A, FIG. 4B, and FIG. 5 was produced. It was confirmed that automatic focus operation was performed in accordance with an applied alternating voltage.

(Example 24) (Electronic Device)

Through the use of the piezoelectric element of Example 1, the electronic device illustrated in FIG. 6 was produced. It was confirmed that speaker operation was performed in accordance with an applied alternating voltage.

The piezoelectric material of the present invention expresses satisfactory and stable piezoelectricity even in a wide operation temperature range. In addition, the piezoelectric material of the present invention is free of lead, and hence has a small load on the environment. Accordingly, the piezoelectric material of the present invention can be used without any problem even for a device using a great amount of piezoelectric material, such as an optical equipment or electronic device including a vibration wave motor or a vibration wave motor.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-025090, filed Feb. 14, 2017, and Japanese Patent Application No. 2018-022426, filed Feb. 9, 2018, which are hereby incorporated by reference herein in their entirety.

What is claimed is:

1. A piezoelectric material, comprising a metal oxide containing at least Ba, Ca, Ti, Zr, and Mn,
wherein the piezoelectric material has a perovskite structure,
wherein:
x, which represents a ratio of a content (mol) of Ca to A (mol) representing a total content of Ba and Ca, falls within a range of $0.10 \leq x \leq 0.18$;
y, which represents a ratio of a content (mol) of Zr to B (mol) representing a total content of Ti, Zr, and Mn, falls within a range of $0.055 \leq y \leq 0.085$; and
z, which represents a ratio of a content (mol) of Mn to the B (mol), falls within a range of $0.003 \leq z \leq 0.012$, and
wherein the piezoelectric material satisfies a relationship of $0 \leq (|d_{31(-20u)} - d_{31(-20d)}|)/|d_{31(-20u)}| \leq 0.08$, and has a value of 130 pm/V or more for each of $|d_{31(-20u)}|$ and $|d_{31(-20d)}|$, where:
$d_{31(-20u)}$ represents a piezoelectric constant $d_{31}$ measured by increasing a temperature of the piezoelectric material from $-30°$ C. to $-20°$ C.; and
$d_{31(-20d)}$ represents a piezoelectric constant $d_{31}$ measured by decreasing the temperature of the piezoelectric material from $25°$ C. to $-20°$ C.

2. The piezoelectric material according to claim 1, wherein the piezoelectric material satisfies a relationship of $1 \leq (|d_{31(-20u)}| + |d_{31(-20d)}|)/2|d_{31(rt)}| \leq 2$, where $d_{31(rt)}$ represents a piezoelectric constant $d_{31}$ at $25°$ C. of the piezoelectric material.

3. The piezoelectric material according to claim 1, wherein a, which represents a ratio of the A (mol) to the B (mol), falls within a range of $0.98 \leq a \leq 1.01$.

4. The piezoelectric material according to claim 1, further comprising a component formed of Bi, wherein a molar ratio of Bi to the metal oxide is 0.15% or more and 0.40% or less.

5. The piezoelectric material according to claim 1, wherein the piezoelectric material has a mechanical quality factor $Q_m$ at $-20°$ C. of 400 or more.

6. A manufacturing method for the piezoelectric material according to claim 1, comprising:
obtaining granules for forming by coating, with a binder, raw material powder containing at least one kind selected from the group consisting of the following raw material 1, raw material 2, and raw material 3 each having a perovskite structure;
obtaining a compact by forming the granules for forming; and
obtaining the piezoelectric material by sintering the compact under a calcination condition of a temperature of up to $1,200°$ C. or more and $1,450°$ C. or less,
the raw material 1 containing Ba, Ti, and Zr, in which p, which represents a ratio of a content of Zr to a total content (mol) of Ti and Zr, falls within a range of $0.00005 \leq p \leq 0.0020$,
the raw material 2 containing Ca, Ti, and Zr, in which q, which represents a ratio of a content of Zr to a total content (mol) of Ti and Zr, falls within a range of $0.00005 \leq q \leq 0.0200$,
the raw material 3 containing Ca, Ti, and Zr, in which r, which represents a ratio of a content of Ti to a total content (mol) of Ti and Zr, falls within a range of $0.00005 \leq r \leq 0.0060$.

7. The manufacturing method for the piezoelectric material according to claim 6, wherein, when weights of the raw material 1, the raw material 2, and the raw material 3 in the raw material powder are represented by M1, M2, and M3, respectively, the M1, the M2, and the M3 satisfy the following relationships.

$$0.87 \leq M1/(M1+M2+M3) \leq 0.930$$

$$0.009 \leq M2/(M1+M2+M3) \leq 0.078$$

$$0.043 \leq M3/(M1+M2+=M3) \leq 0.070$$

8. A piezoelectric element, comprising:
an electrode; and
a piezoelectric material portion,
wherein a piezoelectric material for forming the piezoelectric material portion comprises the piezoelectric material according to claim 1.

9. The piezoelectric element according to claim 8, wherein the piezoelectric element has a multilayered structure in which the electrode and the piezoelectric material portion are stacked alternately.

10. A vibration wave motor, comprising:
- a vibrating body including the piezoelectric element according to claim 8; and
- a moving body to be brought into contact with the vibrating body.

11. An optical equipment, comprising a drive unit, wherein the drive unit includes the vibration wave motor according to claim 10.

12. An electronic device, comprising the piezoelectric element according to claim 8.

* * * * *